US 6,690,311 B2

(12) United States Patent
Lundin et al.

(10) Patent No.: US 6,690,311 B2
(45) Date of Patent: *Feb. 10, 2004

(54) ADAPTIVELY CALIBRATING ANALOG-TO-DIGITAL CONVERSION WITH CORRECTION TABLE INDEXING

(75) Inventors: Henrik Lundin, Sollentuna (SE); Peter Händel, Stockholm (SE); Mikael Skoglund, Tullinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 58 days.

This patent is subject to a terminal disclaimer.

(21) Appl. No.: 09/965,540

(22) Filed: Sep. 26, 2001

(65) Prior Publication Data

US 2002/0093439 A1 Jul. 18, 2002

Related U.S. Application Data

(63) Continuation-in-part of application No. 09/596,803, filed on Jun. 19, 2000, now Pat. No. 6,407,685, which is a continuation-in-part of application No. 09/196,811, filed on Nov. 20, 1998, now Pat. No. 6,127,955, which is a continuation-in-part of application No. 09/738,229, filed on Dec. 15, 2000.
(60) Provisional application No. 60/255,700, filed on Dec. 15, 2000.

(51) Int. Cl.$^7$ .............................. H03M 1/10; H03M 1/12
(52) U.S. Cl. ........................................ 341/120; 341/155
(58) Field of Search ................................ 341/144, 155, 341/118, 119, 120

(56) References Cited

U.S. PATENT DOCUMENTS

| 4,535,319 A | 8/1985 | Penney .................. 340/347 |
| 4,736,189 A | 4/1988 | Katsumata et al. ......... 340/347 |
| 4,903,023 A | 2/1990 | Evans et al. ............... 341/120 |
| 4,903,024 A | 2/1990 | Evans et al. ............... 341/120 |
| 4,943,807 A | * 7/1990 | Early et al. ............... 341/120 |
| 5,047,772 A | * 9/1991 | Ribner ...................... 341/118 |
| 5,101,205 A | 3/1992 | Yasuda ..................... 341/155 |
| 5,266,951 A | 11/1993 | Kuegler et al. ............ 341/120 |
| 5,351,016 A | * 9/1994 | Dent ......................... 332/103 |
| 5,361,067 A | 11/1994 | Pinckley ................... 341/120 |

(List continued on next page.)

FOREIGN PATENT DOCUMENTS

| EP | 0 550 187 A | 12/1992 |
| EP | EP 0550 187 A | 12/1992 |
| WO | WO 00/31876 | 6/2000 |

OTHER PUBLICATIONS

*Digital–Domain Calibration of Multistep Analog–to–Digital Converters*, by Seung–Hoon Lee and Bang–Sup Song, Senior Member, IEEE; IEEE Journal of Solid–State Circuits; vol. 27, No. 12, Dec. 1992, pp. 1679–1688.

(List continued on next page.)

*Primary Examiner*—Jean Bruner Jeanglaude

(57) ABSTRACT

Methods, systems, and arrangements enable true wide-band calibration of analog-to-digital conversion (ADC) using correction table indexing. The frequency of an analog input signal that corresponds to a digital output sample is accounted for, at least partially, when accessing a correction table during the creation and use thereof. For example, in addition to at least a portion of a current sample, at least portion(s) of previous and/or subsequent samples may be used to build (e.g., by bit concatenation) an index for addressing a correction table memory. In effect, compensation may be achieved for ADC errors that are frequency dependent. This correction table indexing may advantageously be employed along with a scheme that estimates one or more parameters of the analog input signal in the digital domain on a sample-by-sample basis in order to reconstruct the analog input signal in the digital domain.

43 Claims, 11 Drawing Sheets

U.S. PATENT DOCUMENTS

| | | | | |
|---|---|---|---|---|
| 5,499,027 | A | | 3/1996 | Karanicolas et al. ......... 341/120 |
| 5,523,899 | A | * | 6/1996 | Parken et al. ............. 360/77.04 |
| 5,621,406 | A | * | 4/1997 | Goetzinger et al. .......... 341/118 |
| 5,644,308 | A | | 7/1997 | Kerth et al. ................ 341/120 |
| 5,754,973 | A | | 5/1998 | Akune ........................ 704/205 |
| 5,771,012 | A | | 6/1998 | Shu et al. ................... 341/118 |
| 5,793,319 | A | | 8/1998 | Ard ............................ 341/120 |
| 5,861,826 | A | * | 1/1999 | Shu et al. ................... 341/120 |
| 5,861,828 | A | | 1/1999 | Opris ......................... 341/120 |
| 5,990,814 | A | | 11/1999 | Croman et al. ............. 341/118 |
| 6,127,955 | A | | 10/2000 | Handel et al. .............. 341/120 |
| 6,384,757 | B1 | * | 5/2002 | Kosonen .................... 341/120 |
| 6,407,685 | B1 | | 6/2002 | Handel et al. | |
| 6,420,991 | B1 | * | 7/2002 | Yu ............................. 341/118 |
| 6,445,317 | B2 | | 9/2002 | Lundin et al. | |

OTHER PUBLICATIONS

*Predictive Digital Filtering of Sinusoidal Signals*, by Peter Händel, Member, IEEE IEEE Transactions on Signal Processing, vol. 46, No. 2, Feb. 1998, pp. 364–374.

*Single–Tone Parameter Estimation from Discrete–Time Observations* by David C. Rife, Senior Member, IEEE, and Robert R. Boorstyn, Member, IEEE, IEEE Transactions on Information Theory, vol. IT–20, No. 5, Sep. 1974, pp. 591–598.

*Digital Signal Processing–Principles, Algorithms and Applications* by J.G. Proakis and D.M. Manolakis, Prentice Hall International, Third Edition, 1996, Chapter 9.2, pp. 748–763.

*Least Squares Quantization in PCM* by Stuart P. Lloyd, IEEE Transactions on Information Theory, vol. IT–28, No. 2, Mar. 1982, pp. 129–137.

*1989 IEEE International Symposium on Circuits and Systems*; Real–Time Equalization of A/D Converter Nonlinearities by D. Moulin; Portland, OR, May 8–11, 1989, vol. 1, No. SYMP. 22, May 8, 1989, pp. 262–267, XP000131234; Institute of Electrical and Electronics Engineers.

John M. Richardson; Correlation of a Signal with an Amplitute–Distorted Form of Itself, IEEE Transactions on Infomation Theory, vol. IT–20, No. 5, Sep.; p. 598.

IEEE STD–1241 *Standard For Terminology and Test Methods for Analog–to–Digital Converters*, pp. 1498–1503, 1999.

Tilden, Linnenbrink and Green; *Overview of the IEEE–STD–1241 Standard For Terminology and Test Methods for Analog–to–Digital Converters*; 16th IEEE Instrsumentation and Measurement Technology Converence, 1999; IMTC/99, vol. 3, pp. 1498–1503.

D. Moulin and D.S. Ledwell.; *On A/D Converter Linearization Using Two–Dimensional Error–Correction Tables*; The Mitre Corporation, U.S.A.; pp. 1–6; XP002225339 (No date).

H. Lundin, et al; *On External Calibration of Analog–To–Digital Converters*; Proceedings of the 11th IEEE Signal Processing Workshop on Statistical Signal Processing; pp. 377–380; XP002225338 (2001).

International Search Report for PCT/SE 01/02755 dated Dec. 17, 2002.

D. Moulin and D. S. Ledwell.; *On A/d Converter Linerarization Using Two–Dimensional Error Correction Tables;* The Mitre Corporation, U.S.A.; pp. 1–6; XP002225339 (no date).

H. Lundin, et al.; *On External Calibration of Analog–To–Digital Converters;* Proceedings of the 11th IEEE Signal Processing Workshop on Statistical Signal Processing, pp. 377–380; XP002225338 (2001).

International Search Report for PCT/SE01/02755 dated Dec. 17,2002.

* cited by examiner

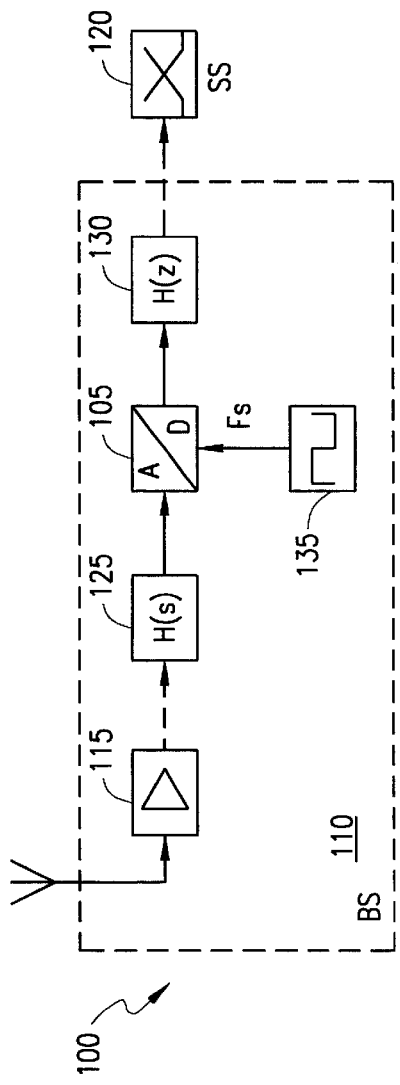
FIG. 1
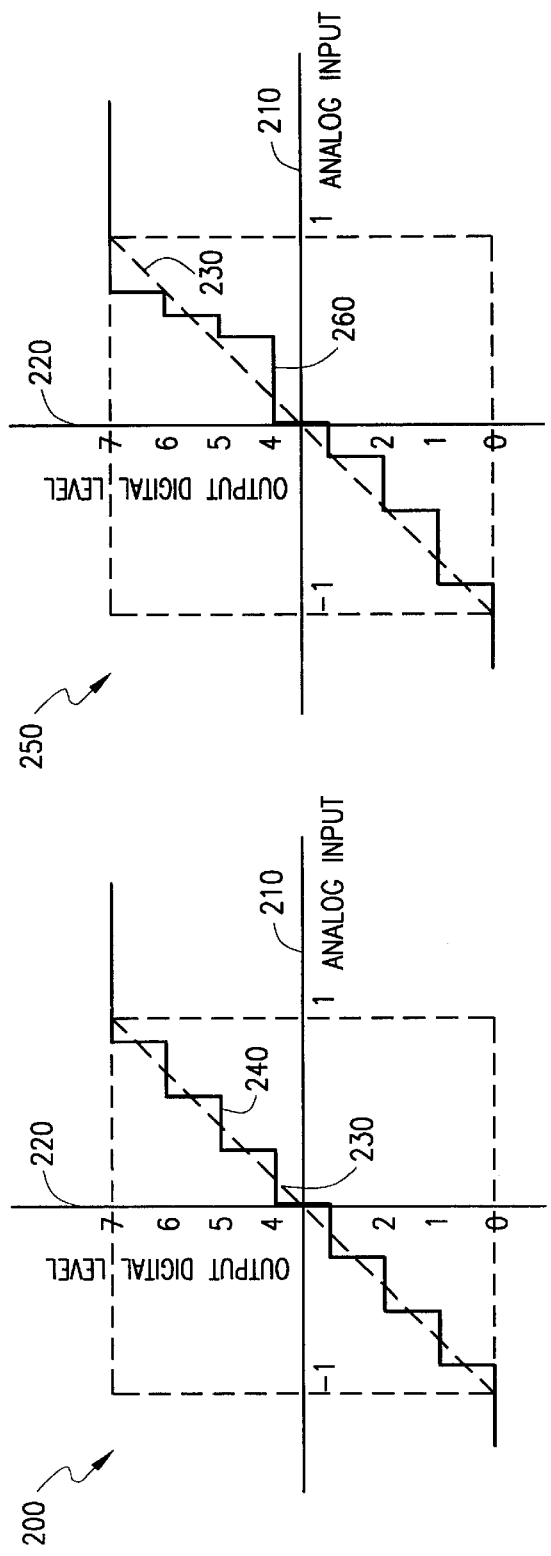
FIG. 2A
FIG. 2B

ADAPTIVELY CALIBRATING ANALOG-TO-DIGITAL CONVERSION WITH CORRECTION TABLE INDEXING

CROSS-REFERENCES TO RELATED APPLICATION

This U.S. Nonprovisional Application for Patent claims the benefit of priority from U.S. Provisional Application for Patent Ser. No. 60/255,700, filed Dec. 15, 2000, the entire disclosure of which is hereby incorporated by reference herein.

This U.S. Nonprovisional Application for Patent is a Continuation-in-Part of U.S. Nonprovisional Application for patent Ser. No. 09/596,803, filed Jun. 19, 2000 now a U.S. Pat. No. 6,407,685, which is a Continuation-in-Part of U.S. Nonprovisional Application for patent Ser. No. 09/196,811, filed Nov. 20, 1998, now U.S. Pat. No. 6,127,955, both of which are hereby incorporated by reference in their entirety herein.

This U.S. Nonprovisional Application for Patent is also a Continuation-in-Part of U.S. Nonprovisional Application for patent Ser. No. 09/738,229, filed on Dec. 15, 2000, which is also hereby incorporated by reference in its entirety herein.

BACKGROUND OF THE INVENTION

1. Technical Field of the Invention

The present invention relates in general to the field of analog-to-digital converters (ADCs), and in particular, by way of example but not limitation, to digital calibration of ADCs involving a correction table that is adapted to compensate for wide-band calibration. The calibration may optionally be accomplished adaptively with dynamic estimation of reference signals that have unknown parameters.

2. Description of Related Art

The natural world operates in an analog domain, but information signals (voice, data, etc.) may frequently be processed, transmitted, or otherwise manipulated more efficiently in the digital domain. The conversion from the analog domain to the digital domain is accomplished with ADCs. An ADC receives as input an analog signal and produces as output a digital signal. However, some information present in the analog signal is necessarily lost during the conversion process even if an ADC is operating in an ideal manner. Unfortunately, real-world ADCs do not operate in an ideal manner. Consequently, the digital output of a real-world ADC does not track the analog input even as accurately an ideal ADC.

It is therefore beneficial to make and/or tune real-world ADCs to approximate ideal ADCs. Techniques have been developed to calibrate real-world ADCs so as to modify their performance to emulate ideal ADCs as closely as possible. For example, ADCs are traditionally calibrated using high precision digital voltmeters to characterize the errors that result from digitizing static or slowly varying analog reference voltages. The outcome from this static testing forms the basis for a hardware or software implemented (e.g., table look-up) calibration scheme. Another method of conventional ADC calibration is the use of a sinusoidal reference signal. The reference is sampled, and estimations of the ideal sample values are calculated. These estimations are calculated using a minimum squared error criterion that requires knowledge of the frequency of the calibration signal. The errors (i.e., the difference between the estimated values and the actual sampled values output by the ADC being calibrated) are then used to build a correction table. The correction table may subsequently be used to modify sampled values of actual (e.g., non-calibration, functional, etc.) analog input signals.

Efficient calibration schemes require that the reference signal be dynamically estimated on a sample-by-sample basis during the ADC calibration period(s). No method previously existed for dynamic estimation of a reference signal (e.g., a calibration signal) with one or more unknown parameters (e.g., frequency, phase, etc.) during an ADC calibration. The pre-existing calibration procedures relied on accurate and costly signal generators and/or precise and expensive measuring components.

However, a parent application (U.S. Ser. No. 09/196,811, now U.S. Pat. No. 6,127,955) of this patent application addressed these deficiencies of pre-existing calibration procedures by dynamically estimating a reference signal having one or more unknown parameters. Nevertheless, the invention of the parent application was primarily directed, with respect to frequency estimation, to the problem of calibrating ADCs that operate in a narrow frequency band. Since the linearity errors in general are frequency dependent, correction tables in accordance with the invention of the parent application are primarily useful for frequencies near the calibration frequency. The invention of the parent application does not therefore address the problem of wide-band calibration of ADCs. Consequently, implementations in accordance with the invention of the parent application do not optimally calibrate ADCs that are to be operated in a broad frequency band.

Furthermore, in existing approaches that do attempt ADC calibration by employing a sinusoidal reference signal that alternates between/among a number of fixed frequencies (instead of remaining at only a single fixed frequency), any correction table built using the reconstructed reference signal (whether from a minimum-mean-squared-error criterion technique or otherwise) is still deficient with respect to wide-band calibration. No frequency information is utilized when accessing the correction table, during either creation or functional use. Consequently, existing ADC calibration approaches entail either fully narrow-band calibrations with correction tables that are only calibrated for frequencies close to the single calibration frequency or partly wide-band calibrations with correction tables that are only calibrated for the average error over the number of fixed frequencies of the sinusoidal reference signal. Because ADC errors are frequency dependent, no existing approach fully calibrates an ADC over a wide frequency band.

SUMMARY OF THE INVENTION

The deficiencies of the prior art are overcome by the methods, systems, and arrangements of the present invention. For example, as heretofore unrecognized, it would be beneficial if the accessing of (e.g., the storing to and/or the retrieving from) correction tables compensated for a wide frequency band. In fact, it would be beneficial if such wide-band compensation were achieved by accessing an ADC calibration correction table using all or part of one or more past and/or future (e.g., previously buffered "future" values of) ADC output(s) as well as the current ADC output.

Methods, systems, and arrangements enable true wide-band calibration of analog-to-digital conversion using correction table indexing. The frequency of an analog input signal that corresponds to a digital output sample is accounted for, at least partially, when accessing a correction table during both calibration and functional use thereof. For example, with respect to certain embodiment(s), in addition to at least a portion of a current sample, at least portion(s) of one or more previous and/or subsequent sample(s) may be used to build (e.g., by bit concatenation) an index for addressing a correction table memory. In effect, compensation may be achieved for ADC errors that are frequency dependent. This correction table indexing approach may advantageously be employed along with, for example, a scheme that estimates one or more parameters of the analog input signal in the digital domain on a sample-by-sample basis in order to reconstruct the analog input signal in the digital domain. When the corresponding parameter estimation and signal reconstruction filter(s) are converged, a wide-band corrective data structure may be updated using, e.g., a concatenated index.

The above-described and other features of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

BRIEF DESCRIPTION OF THE DRAWINGS

A more complete understanding of the methods, systems, and arrangements of the present invention may be had by reference to the following detailed description when taken in conjunction with the accompanying drawings wherein:

FIG. 1 illustrates an exemplary ADC environment in which the present invention may be advantageously implemented;

FIG. 2A illustrates an exemplary analog input signal versus digital output signal graph of an ideal ADC;

FIG. 2B illustrates an exemplary analog input signal versus digital output signal graph of a practical ADC;

DETAILED DESCRIPTION OF THE DRAWINGS

Figure 3A:
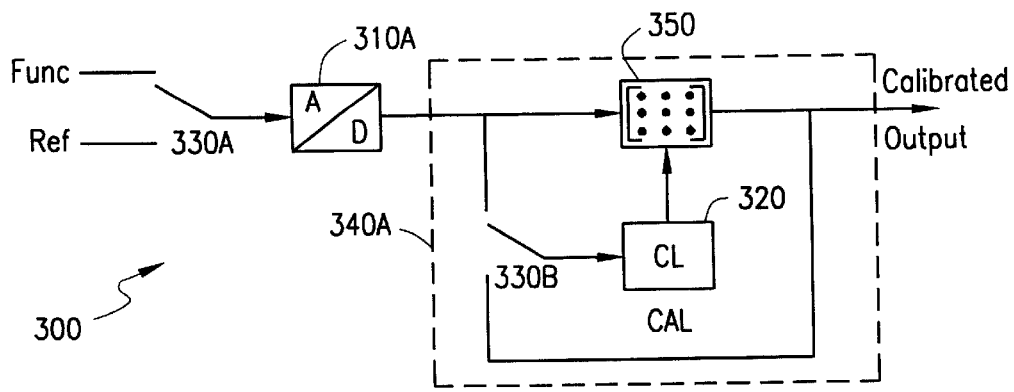
FIG. 3A illustrates an exemplary application of calibration in accordance with the present invention.

A preferred embodiment of the present invention and its advantages are best understood by referring to FIGS. 1-13B of the drawings, like numerals being used for like and corresponding parts of the various drawings.

Referring now to FIG. 1, an exemplary ADC environment in which the present invention may be advantageously implemented is illustrated. An ADC 105 is shown as part of a telecommunications system environment 100. Specifically, environment 100 includes a receiver 115 of a mobile radio system base station (BS) 110 in communication with a telephone switching system (SS) 120 (e.g., a node in a wireline system). The receiver 115 provides an analog incoming signal (e.g., transmitted from a mobile station (MS) (not shown) of the mobile radio system) to an analog filter H(s) 125 that limits the bandwidth of the ADC 105 analog input signal to one Nyquist zone. The digital output signal of the ADC 105 is connected to a digital filter H(z) 130, which may further filter the incoming signal. The output of the digital filter H(z) 130 may be processed further and forwarded to the SS 120.

The ADC 105 converts a time continuous and amplitude continuous signal to a time discrete and amplitude discrete signal. The output data rate of the ADC 105 is controlled by a sampling clock generator 135 with frequency $F_s$, which is also the data rate of the ADC output. The ADC 105 may optionally include a sample and hold (S/H) circuit (not shown in FIG. 1), which holds an instantaneous value of the (analog filtered) analog input signal, which is received from the analog filter H(s) 125, at selected instants of time so that the ADC 105 may sample them.

The ADC 105 quantizes each sampled analog input signal into one of a finite number of levels and represents (e.g., codes) each level into a bit pattern that is delivered as the digital output at the rate of the sampling clock generator 135. The digital output of the ADC 105 is composed of an exemplary number of eight (8) bits. Hence, 256 levels may be represented. The telecommunications system environment 100 will be used to describe a preferred embodiment of the present invention. However, it should be understood that the principles of the present invention are applicable to other ADC environments, such as video implementations, delta modulation, a flash ADC, an integrating ADC, pulse code modulation (PCM), a sigma-delta ADC, and a successive approximation ADC.

Referring now to FIG. 2A, an exemplary analog input signal versus digital output signal graph of an ideal ADC is illustrated. The ideal ADC graph is shown generally at 200. The abscissa axis 210 represents the analog input, and the ordinate axis 220 represents the level of digital output. The dashed diagonal line 230 represents a linear, non-quantized output response for the analog input signal; it is used here as an aiming line for the quantized output. The corresponding output of the ideal ADC is represented by the stair-stepped line 240. As can be seen, the ideal ADC digital output 240 tracks the analog input 230 as accurately as possible with a given number of quantization levels (e.g., resolution) and sampling rate.

Referring now to FIG. 2B, an exemplary analog input signal versus digital output signal graph of a practical ADC is illustrated. The practical ADC graph is shown generally at 250. The dashed diagonal line 230 is again shown as an aiming line for ideal mid-step transition of the digital output. The corresponding output of the practical ADC is represented by the roughly stair-stepped line 260. As can be seen, the practical ADC digital output 260 does not track the analog input 230 as accurately as does the ideal ADC (of FIG. 2A) with the same given number of quantization levels and sampling rate. Thus, it can be seen that the effective number of bits $b_{EFF}$ of a b-bit ADC may differ from the actual number of bits (b) due to errors (e.g., offset errors, gain errors, and linearity errors) that can cripple the dynamic range. The ADC calibration principles of the present invention advantageously ameliorate these various error conditions.

Application of the ADC calibration principles of the present invention and/or inventions of the parent applications provides many advantages over conventional approaches. For example, robustness against variations in the analog calibration signal is provided. There is no need for highly-stable signal generators because the present invention and/or inventions of the parent applications calculate relevant parametrical information from quantized samples of the calibration signal utilizing prior knowledge of the waveform type. The calibration signal may be generated by a low-complexity, low-precision (but spectrally pure) local oscillator included in the system using the ADC (e.g., the system may be an integrated circuit (IC), BS, etc.). The present invention allows for a design using two ADCs that switches between reference and functional input signals, where one ADC is being calibrated while the other is running functionally. Using this solution, the calibrated ADC(s) may be sensitive to temperature drift without requiring the cessation of functional data conversion while implementing repetitive calibration.

Another exemplary advantage of the present invention and/or inventions of the parent applications is increased efficiency as compared to conventional solutions. Because the filter (as explained further below) yields a better estimation of the reference signal than prior methods, fewer samples of the reference signal are needed for calibration. Additionally, the calibration scheme may be fully implemented in software. If the system the ADC is connected to has sufficient overflow capacity, then no additional digital signal processing (DSP) resources (e.g., hardware, processing cycles, etc.) are needed. In principle, the calibration may be made transparently during normal operation and delayed by only a memory access by utilizing, for example, a known pilot, as explained further below. The correction table may therefore be trained incrementally with short bursts of samples from the pilot tone used as a reference signal, thus allowing for a design using only one ADC, which is alternately connected to the reference signal and calibrated incrementally during known intermissions of the incoming functional signal.

A pilot is a signal which stands apart from the information portion of the overall signal channel, but is carried by the same physical transmission medium. The pilot may occupy just one frequency in the utilized signal band (a so-called pilot tone), and the information may be spread in frequency to the side or around the pilot, but not on the same frequency as the pilot. A pilot is often used to adjust the system to carry the information with as high a quality as possible. Because the pilot has well-known characteristics, it may be measured and used to adjust signal level, synchronize clocks, etc., regardless of the information carried on the channel. In accordance with the principles of the present invention and/or inventions of the parent applications, the pilot signal, which may already be present in the relevant system for other purposes, may be used as a reference signal to calibrate the ADC.

A still further advantage provided by application of the principles of the present invention and/or inventions of the parent applications is that the calibration scheme may adapt to the reference signal, requiring knowledge of the waveform type only. This allows for both a calibration procedure using several different frequencies and a design using an extended correction table. The correction table addressing is then extended with addresses depending upon the difference between the value of the previous sample and that of the current sample. This corrects the dynamic aspect of the errors in the ADC. Moreover, improvement of the linearity may be enhanced still further by preloading the correction table and using the output thereof for the calibration scheme. Thus, the calibrator becomes a feedback system. The improvement is due, at least in part, to the more-accurate amplitude estimation of the reference signal.

Referring now to FIG. 3A, an exemplary application of calibration in accordance with the present invention is illustrated. An ADC 310A and calibrator 340A are shown generally at 300. The ADC 310A may receive an analog functional input signal, and the calibrator 340A produces a digital calibrated output signal. The ADC 310A may be, for example, equivalent to the ADC 105 (of FIG. 1), and the calibrator 340A may include a correction table 350. When the ADC 310A is to be processing an incoming functional signal, a switch 330A is connected to the functional signal, and a switch 330B need not be connected to the output of the ADC 310A. However, when the functional signal is engaged in a known intermission, for example, the switch 330A is connected to the reference signal, and the switch 330B connects the output of the ADC 310A to the calibration logic (CL) 320. The CL 320 may produce correction table outputs for the correction table 350. In this manner, the speed of the CL 320 of the present invention enables real-time calibration with only a single ADC 310A. It should be understood that the switch 330B may alternatively be part of the calibrator 340A.

Thus, the switch 330A serves to switch between the functional operating mode and the calibration operating mode. The switch 330B, on the other hand, also enables a feedback system to be activated during calibration. The calibration procedure may therefore be accomplished in two phases. In the first phase, the switch 330B is connected to the ADC 310A output. When the correction table 350 has been trained, the switch 330B is connected to the output of the correction table 350, which enables a finer tuning of the table. The ADC 310A and the calibrator 340A of 300, for example, may benefit from calibration using a pilot tone. For example, if there is a pilot tone with an amplitude using most of the ADC 310A input range on the functional signal and if there exists a known intermission in the information carrying part of the spectrum, then this intermission can be used for ADC calibration using the pilot as a calibrating reference.

Figure 3B:
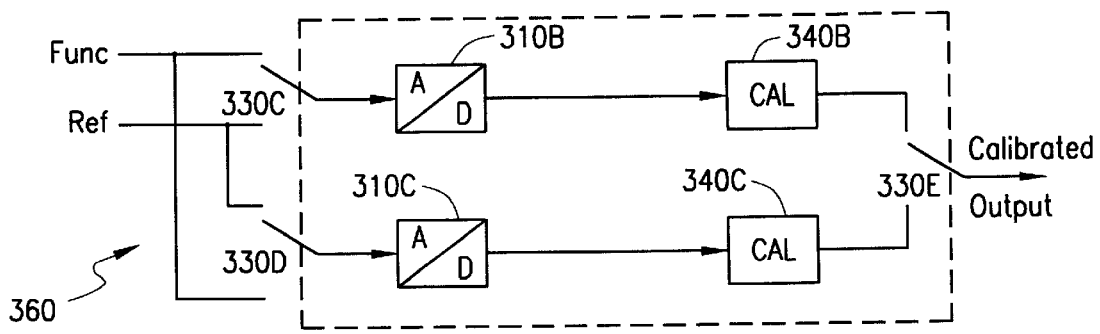
FIG. 3B illustrates another exemplary application of calibration in accordance with the present invention.

Referring now to FIG. 3B, another exemplary application of calibration in accordance with the present invention is illustrated. The present invention also enables real-time calibration with two ADCs as shown generally at 360. A reference signal and a functional signal are alternately input to a pair of ADCs 310B and 310C via switches 330C and 330D, respectively. While one is receiving the reference signal, the other is receiving and operating on the functional signal. ADC 310B and 310C forward their outputs as inputs to calibrators 340B and 340C, respectively. Switch 330E selects, for providing as the calibrated output, the forwarded digital signal that corresponds to the analog functional input signal. In this manner, calibration may be constantly in process, if desired. Advantageously, this two-ADC exemplary application enables, during a normal calibration operation, calibration to account for drift and changes during the normal operation.

It should be noted that the calibration resources may be shared, except for the correction table 350. In other words, a single calibrator 340 may alternatively receive the output of the ADCs 310B and 310C (e.g., by means of a switch) (not shown). The three switches 330C, 330D, and 330E may be synchronized. The switch transition is preferably a fraction of the sampling period so that functional converted data passing through the system is not interrupted. In the exemplary application 360, the ADCs 310B and 310C preferably do not have an internal delay in order for all the switches to be in the same phase. This may be solved, however, with a delay of the output switch 330E (not explicitly shown).

Figure 4A:
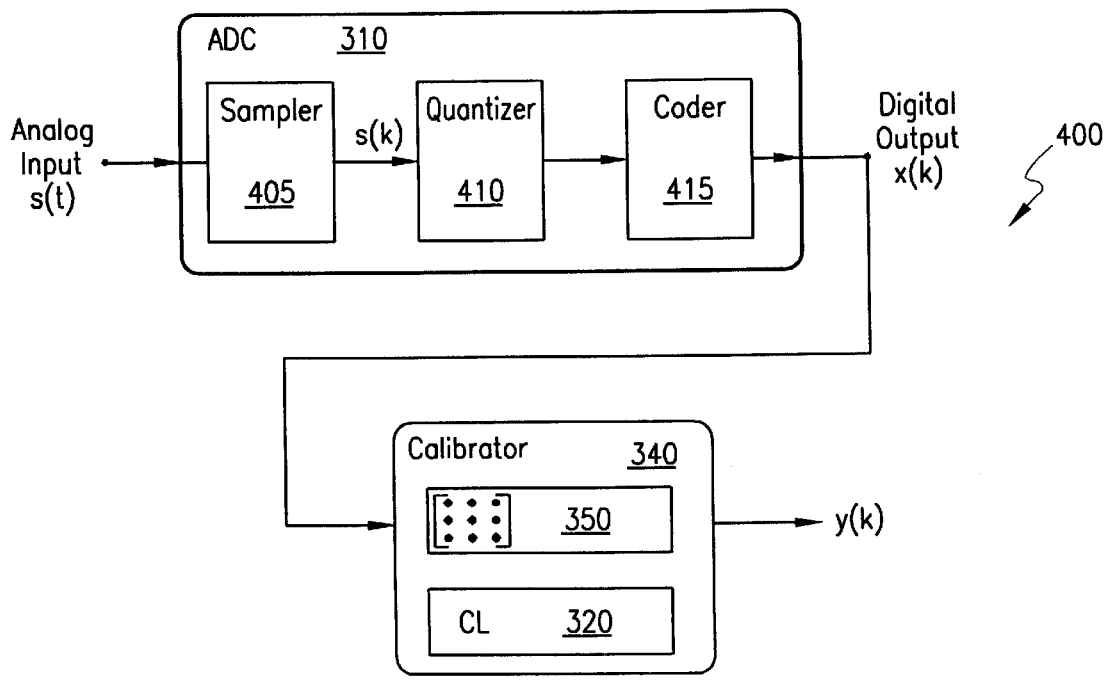
FIG. 4A illustrates an exemplary ADC and an associated calibrator with selected signals denoted in accordance with certain embodiments of the present invention.

Referring now to FIG. 4A, an exemplary ADC and an associated calibrator are illustrated with selected signals denoted in accordance with the present invention. An exemplary ADC 310 and an exemplary calibrator 340 are shown generally at 400. The analog input signal s(t) (e.g., an airborne radio wave analog voice signal emanating from an MS transmitter (not shown), received at the receiver 115 (of FIG. 1), and frequency downconverted and filtered inside the BS 110) is supplied to the ADC 310. The ADC 310 may correspond to, for example, the ADC 105 of the BS 110 (of FIG. 1). It should be understood that the ADC 310 (and hence the ADC 105) may include the calibrator 340.

Continuing with FIG. 4A, the ADC 310 may include, for example, a sampler 405, a quantizer 410, and a coder 415. It should be understood, however, that the present invention is applicable to other ADC designs. The sampler 405 samples the incoming analog input signal s(t) and produces the time discrete sampled signal s(k), which is forwarded to the quantizer 410. The signal is then converted to the digital output x(k) by the quantizer 410 and the coder 415. The digital output x(k) is supplied to the calibrator 340, which includes the correction table 350 and the CL 320. The calibrator 340 then produces the calibrated digital signal y(k).

Figure 4B:
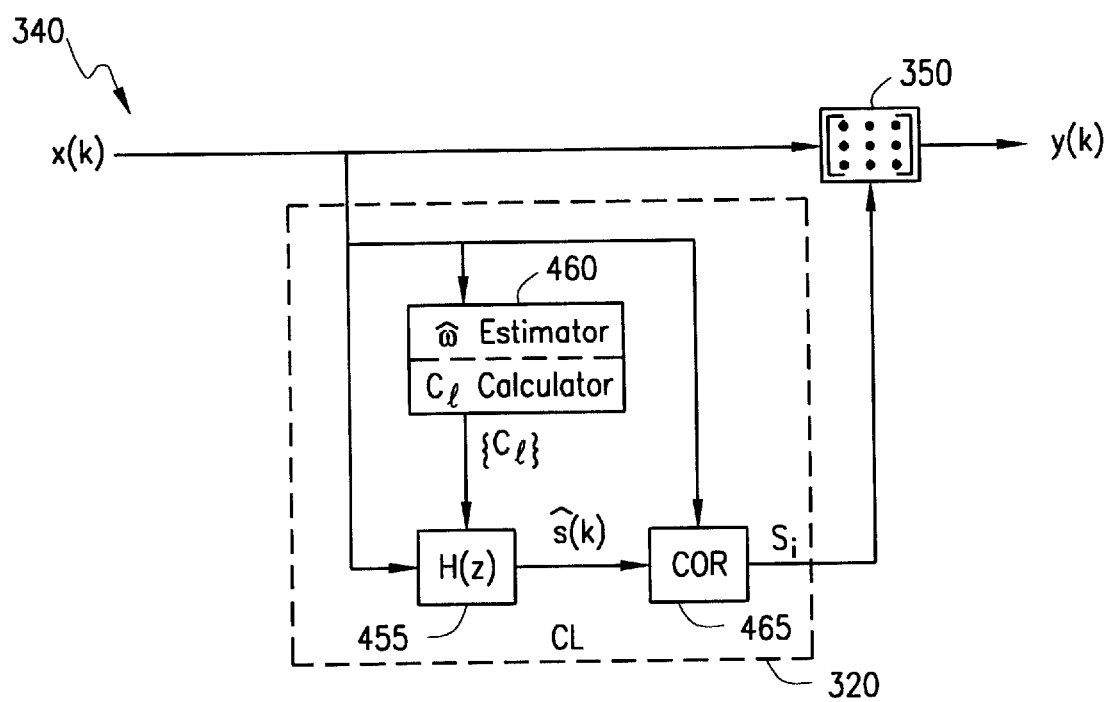
FIG. 4B illustrates exemplary details of one embodiment of calibration logic in accordance primarily with an invention of a parent application.

Referring now to FIG. 4B, exemplary details of one embodiment of calibration logic in accordance primarily with an invention of a parent application are illustrated. The calibrator 340 is shown receiving the digital output signal x(k) of the ADC 310 (of FIG. 4A) and producing the calibrated digital signal y(k). The calibrator 340 includes the correction table 350 and the CL 320. The digital output signal x(k) is supplied to three exemplary components of the CL 320, which are described in mathematical detail below. First, the digital output signal x(k) is supplied as an input to an estimator/calculator 460. The estimator/calculator 460 (i) estimates at least one parameter (e.g., the frequency $\omega$) relating to the analog input reference signal s(t) and (ii) calculates coefficients (e.g., the coefficients $c_i$). Second, the digital output signal x(k) is supplied as an input (along with the coefficients $c_i$) to a finite impulse response (FIR) filter 455. The FIR filter 455 produces an estimate of s(k) (e.g., $\hat{s}(k)$), where s(k) may, for example, correspond to the output of the sampler 405 (of FIG. 4A). It should be noted that other filter types may alternatively be used. For example, an Infinite Impulse Response (IIR) filter may be used in place of the FIR filter 455.

Third, the correction calculator 465 also receives the digital output signal x(k) as an input. The correction calculator 465 computes table entries (e.g., the values of $S_i$) for the correction table 350 using the digital output signal x(k) along with the calculated $\hat{s}(k)$ from the FIR filter 455. During calibration operation mode, the digital output signal x(k) is used to address the correction table 350, and the output $s_i$ of the correction calculator 465 is the data written/stored to the entry of the correction table 350 for that address. The correction table 350 may be, for example, stored in a memory (e.g., a random access memory (RAM) or a serial access memory (SAM)). It should be understood that the correction table 350 need not be in tabular form, for it may be organized into any convenient data structure.

During functional operation mode, the digital output signal x(k) continues to be used to address the correction table 350, but the value of the table entry at that address is read/retrieved and then output as the variable y(k). Hence, the digital output signal x(k) is passed through the correction table 350 in both functional and calibration operation modes. The correction table 350 is preferably initialized with $s_i=x_i$ for every input level (i=0, . . . , M−1) before functional use of the y(k) data and before any calibration (such initialization is not explicitly shown). The calibration may thus be performed later when a scheduled calibration phase occurs in the system.

Each of the functional units (components) shown in the calibrator 340 are described more fully in mathematical form below. It should be understood that the FIR filter 455, the estimator/calculator 460, and the correction calculator 465 need not be discrete electronic hardware units. Each may alternatively be implemented (either fully or partially) in software using, for example, a general purpose DSP. Furthermore, each may be implemented using excess computing capacity in whatever system (e.g., a BS) in which the calibrator 340 and the ADC 310 are being employed. Moreover, each may be implemented in either hardware, software, firmware, etc., or some combination thereof and/or share resources such as memory and/or processor cycles. It should be further understood that the calibrator 340 may be incorporated as part of the ADC 310.

Figure 4C:
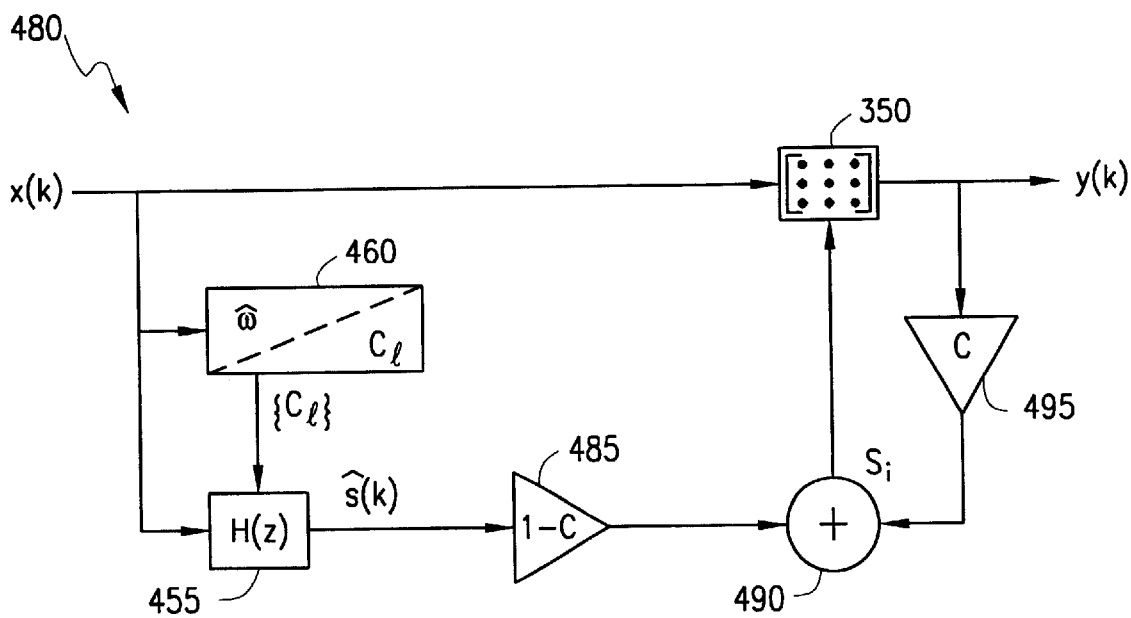
FIG. 4C illustrates exemplary details of another embodiment of calibration logic in accordance primarily with an invention of a parent application.

Referring now to FIG. 4C, exemplary details of another embodiment of calibration logic in accordance primarily with the invention of the parent application are illustrated. The exemplary details of this calibration logic embodiment are designated generally by 480 and are specially targeted for implementations in which the number of calibration samples may be limited. In the calibrator 480, the correction calculator 465 (of the calibrator 340 of FIG. 4B) is replaced by a "(1−C)" multiplier 485, a summer 490, and a "C" multiplier 495, which forms a feedback loop from the output of the correction table 350. The input $s_i$ to the correction table 350 therefore becomes the sum of $Cs_i$ and $(1-C)\hat{s}(k)$. Calibrator 480 will likewise be explained in greater mathematical detail below.

Multiple schemes have previously been proposed in order to calibrate ADCs. In fact, a calibration scheme has recently been proposed that works in the digital domain only in S.-H. Lee and B.-S. Song, "Digital-domain calibration of multi-step analog-to-digital converters", IEEE Journal on Solid-State Circuits, Vol. 27, No. 12, pp. 1679–1688, 1992, which is hereby incorporated by reference in its entirety herein. One drawback with a method such as the one in Lee and Song's article is that it requires accurate signal generators and measurement devices to measure the code errors.

In contradistinction, the calibration scheme for ADCs in accordance with the present invention and/or inventions of the parent applications does not require such accurate signal generators and measurement devices. The scheme may be implemented fully digitally and completely in software. Furthermore, it does not require internal calibration circuitry. The calibration scheme does entail, on the other hand, a calibration signal connected to the ADC input. It also may include the storing of code errors directly in memory; consequently, the normal conversion is not slowed by error calculations.

The calibration procedure utilizes a known waveform as the calibration signal, such as a sine wave signal, a sum of several sine wave signals, a saw-tooth signal, a triangle wave signal, etc. In an exemplary embodiment that is described below, the calibration scheme for sinusoidal calibration signals is described, but it should be understood that other waveform types may be employed. The scheme (primarily of a parent application) may be decomposed into the following exemplary functional blocks, each of which is described in further detail below: First is a processor for estimating the frequency of the analog input s(t), where the estimate $\hat{\omega}$ is computed from the quantized output x(k) of the ADC. Second is a linear time invariant FIR filter having as input the output x(k) of the ADC, such that characteristics of the filter include coefficients which are set to minimize the noise gain. The filter output $\hat{s}(k)$ is a reconstruction of the analog calibration signal at the given sampling instants (in principle, a continuous-amplitude discrete-time signal). And, a third functional block is a processor for computing an updated reconstruction table in dependence upon x(k) and $\hat{s}(k)$.

A derivation of a calibration scheme primarily in accordance with an invention of a parent application is summarized in Table 1.

TABLE 1

Calibration scheme based on:
N quantized values of the sampled calibration signal
s(k) (e.g., {x(0), . . . , x(N − 1)}
where x(k) = $Q_b$[s(k)]).

| | |
|---|---|
| 1. | Calculate an estimate $\hat{\omega}$ of the calibration frequency from {x (0), . . . , x (N − 1)}. An estimate $\hat{\omega}$ is given by (14) below. |
| 2. | For k = 0, . . . , N − 1 construct $\hat{s}(k)$ by aid of linear filtering. The FIR filter (7) has coefficients (10)–(13) with ω there replaced by $\hat{\omega}$ from step 1. The variable L (from (7) and (10)–(13)) is determined from the required number of effective bits in the reconstruction, $b_{IMP}$. (Where $b_{IMP}$ may be computed by: $$b - \frac{10 \log_{10} NG}{6} \approx b - 0.50 + 1.67 \log_{10} L.$$) |

TABLE 1-continued

Calibration scheme based on:
N quantized values of the sampled calibration signal
s(k) (e.g., {x(0), . . . , x(N − 1)}
where x(k) = $Q_b$[s(k)]).

| | |
|---|---|
| 3. | For k = L, . . . , N − 1 and x(k) = $x_1$ update the table entry $s_i$ for some i ∈ {0, . . . , M − 1} from $\hat{s}(k)$ utilizing (17) . The table entries may be initialized by (15). |

Initially, the calibration signal is sampled and quantized. The calibration signal s(t) is a continuous time (t[s] is the time instant) sine wave with frequency F [Hz], amplitude A [Volts] where A>0, and initial phase φ [radians], that is $$s(t)=A \sin(2\pi Ft+\phi). \tag{1}$$

The frequency F is in the range (0, $F_s/2$) where $F_s$ [Hz] is the sampling frequency. An ideal S/H circuit with sampling rate $F_s$ results in a discrete time signal $$s(k)=A \sin(\omega k+\phi) \tag{2}$$

where $\omega=2\pi F/F_s$ is the normalized (angular) frequency in (0, π), and k is a running (integer) time index.

Consider a b-bits uniform quantizer. For simplicity, but without loss of generality, let the maximum swing of the ADC be ±1. Then, the resolution is $$\Delta = \frac{1}{2^{b-1}}. \tag{3}$$

A b-bit quantized signal x(k)=$Q_b$[s(k)] can be modeled as mathematically represented by (4) and as shown in J. G. Proakis and D. M. Manolakis, *Digital Signal Processing-Principles, Algorithms and Applications*, Prentice Hall International, Third Edition, 1996, Chapter 9.2, pp. 748–762, which is hereby incorporated by reference in its entirety herein, $$x(k)=s(k)+e(k) \tag{4}$$

where $Q_b$[·] denotes a b-bits quantizer and e(k) is white zero mean quantization noise with variance $$\sigma^2 = \frac{\Delta^2}{12} = \frac{2^{-2b}}{3}. \tag{5}$$

The model from (4)–(5), describing the quantized output of the ADC, is known to be valid for small quantization steps Δ and when s(k) traverses several quantization levels between two successive samples.

A quality measure for ADCs is the signal-to-quantization noise ratio (SQNR) defined as the ratio of the signal power P to the power of the quantization noise, that is $$SQNR = \frac{P}{\sigma^2} = \frac{3P}{2^{-2b}} \tag{6}$$

where (5) was used in the second equality. For s(k) in (2), it holds that P=$A^2/2$. From (6) it is evident that each additional bit increases SQNR by 20 $\log_{10}$ 2≈6 dB.

Secondly, in order to reconstruct the calibration signal s(k) from the quantized inputs x(k), an L-th order FIR filter is employed, that is $$\hat{s}(k) = \sum_{l=0}^{L} c_l x(k-l). \quad (7)$$

Filter coefficients ($\{c_l\}$ from l=0 to L) are sought such that $\hat{s}(k) \equiv s(k)$ for a noise-free sinusoidal input (2) (after that the transient died away). In addition, $\{c_l\}$ is sought such that the sensitivity against white (quantization) noise is minimized. The sensitivity against noise, or the so called noise gain (NG), is $$NG = \sum_{l=0}^{L} c_l^2. \quad (8)$$

The optimization problem to be solved is min NG subject to $c_0, \ldots, c_L$ $$\min_{c_0,\ldots,c_L} NG \quad \text{subject to} \quad s(k) = \sum_{l=0}^{L} c_l s(k-l) \quad (9)$$

where s(k) is the sine-wave in (2). This optimization problem was solved in P. Händel, "Predictive digital filtering of sinusoidal signals", IEEE Transactions on Signal Processing, Vol. 46, No. 2, pp. 364–375, 1998, which is hereby incorporated by reference in its entirety herein, and the following result holds true $$c_l = \frac{(L+1)\cos l\omega + (S_s - S_c)\cos\omega(l+2) - 2S_{sc}\sin\omega(l+2)}{2(S_c S_s - S_{sc}^2)} \quad (10)$$

$$l = 0, \ldots, L$$

where $$S_s = \sum_{l=1}^{L+1} \cos^2 l\omega \quad (11)$$

$$S_s = \sum_{l=1}^{L+1} \sin^2 l\omega \quad (12)$$

$$S_{sc} = \sum_{l=1}^{L+1} \sin l\omega \cdot \cos l\omega. \quad (13)$$

The reconstruction filter may be composed of (7) where the coefficients are determined by (10)–(13) with $\omega$ there replaced by an estimate $\hat{\omega}$. Obtaining an estimate $\hat{\omega}$ from the A/D output x(k) is described below.

Thirdly, the frequency of the calibration signal s(t) is estimated. The filter coefficients (10)–(13) do not depend on the initial phase or the amplitude of the calibration signal s(t); they only depend on $\omega$. Several methods may be used to estimate the frequency of a noise corrupted sinusoidal signal. For example, D. C. Rife and R. R. Boorstyn, "Single tone parameter estimation from discrete-time observations", IEEE Transactions on Information Theory, Vol. IT-20, No. 5, pp. 591–598, 1974, which is hereby incorporated by reference in its entirety herein, shows that frequency estimation may be mathematically characterized as $$\hat{\omega} = \arg\max_{\omega} \left| \sum_{k=0}^{N-1} x(k) e^{i\omega k} \right|^2. \quad (14)$$

The maximization of (14) may be performed by aid of the fast Fourier transform followed by an iterative minimization. Using the estimate $\hat{\omega}$ from (14) in place of $\omega$ in (10)–(13) completes the reconstruction of s(k) from x(k).

And fourthly, a reconstruction table may be updated using the following exemplary algorithm. The scheme is based on the expression for the optimal, in the sense that $E[e(k)^2]$ is minimized, reconstruction levels in scalar quantization, as derived by S. P. Lloyd, "Least squares quantization in PCM", IEEE Transactions on Information Theory, Vol. IT-28, pp. 127–135, March 1982, which is hereby incorporated by reference in its entirety herein.

The quantized output, x(k), from the ADC has $M=2^b$ possible different values at time instant k. Let these be $$\{x_0, \ldots, x_{M-1}\} \quad (15)$$

where $x_i$ corresponds to the i-th level of a uniform quantizer. For $k \in \{L, L+1, \ldots, N-1\}$, let $A_i(m)$ be the number of times x(k) has been equal to $x_i$, for $L \leq k < m$, and let $A_i(L-1)=0$. Now the reconstruction table $$\{s_0, \ldots, s_{M-1}\} \quad (16)$$

can be constructed from $\hat{s}(k)$ as follows: Let $s_i$ be assigned the initial values $s_i = x_i$, i=0, ..., M−1. Then, assuming that $x(k) = x_i$ at time instant $k \geq L$, update $s_i$ according to $$s_i \rightarrow \frac{A_i(k) s_i + \hat{s}(k)}{A_i(k) + 1}. \quad (17)$$

After the data has been processed, and the table has been updated, the operation of the quantizer becomes: The input signal produces a sample s(k) which is quantized to $x(k)=x_i$, then the quantized value $x_i$ is remapped, using the updated table, to the output $s_i$.

The formula in (17) calculates an average of estimates for every encountered level in the input signal x(k). An averaging process may be considered as similar to a low pass filter. Thus, for an implementation in which the number of calibration samples is limited (e.g., due to limited calibration time or arithmetic resolution in average calculation, for example), the averaging may be replaced with a low pass filter. Consequently, for a limited number of calibration samples per level, the formula (17) may be approximated with $$s_i \rightarrow C s_i + (1-C) \hat{s}(k)$$

$$C = \frac{N-2}{N}. \quad (18)$$

Because the level of x(k) (which defines the variable "i") acts as the address for the correction table 350 (of FIG. 4C), the calibration functionality as defined by (18) may be implemented with the "(1−C)" multiplier 485, the summer 490, and the "C" multiplier 495.

Referring again to an alternative embodiment of an invention of a parent application as illustrated in FIG. 4C, the correction table 350 has a two phase functionality for each sample, one read phase and one write phase. The input signal x(k) with level i acts like an address to the correction table 350 in both phases. In phase one, y(k) gets the value $s_i$ from the correction table 350 and holds it until the end of phase two. This value $s_i$ is multiplied by "C" and summed with the estimate ŝ(k) multiplied by "(1−C)". In phase two, the output of the summation is written to the correction table 350. During functional data conversion, the correction table 350 is still mapping x(k) to a value $s_i$ on the output y(k), but no write operation to the correction table 350 is being performed. If the correction table 350 is not initialized, then there is likely to be more of a transient response from the filtering function, thus demanding more samples than if the correction table 350 is initialized. That is, as long as the input of the filter 455 is not connected to y(k) (i.e., not engaged in the feedback case that may be activated by switch 330B of FIG. 3A), the correction table 350 may be initialized by a longer calibration phase. The frequency estimation and coefficient calculation may also be accomplished during the initialization step alone, especially if the frequency of the reference input signal s(t) to the ADC 310 does not drift outside the passband of the filter 455.

Figure 5:
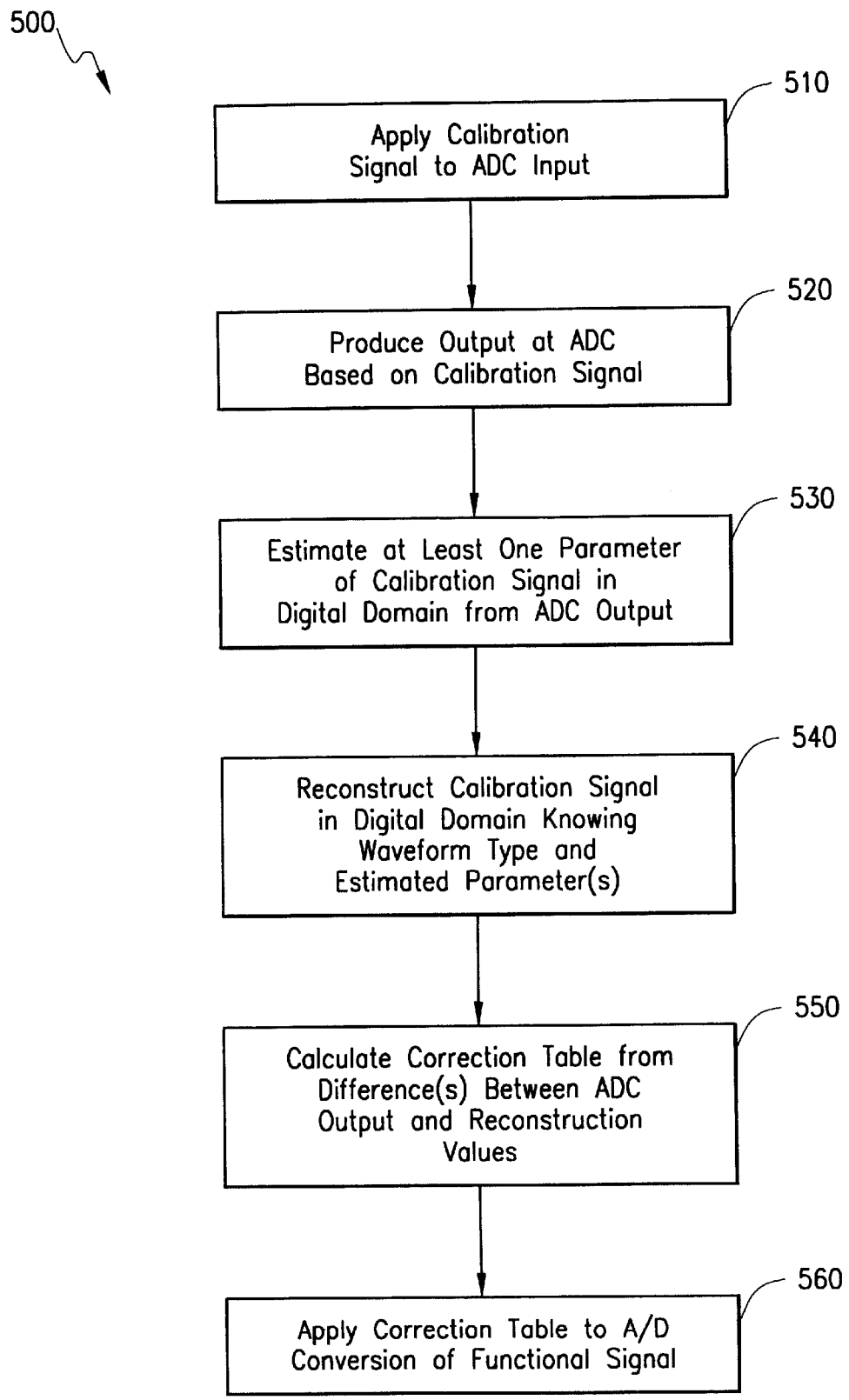
FIG. 5 illustrates a method in flowchart form for calibrating an ADC in accordance with an invention of a parent application.

Referring now to FIG. 5, a method in flowchart form for calibrating an ADC in accordance primarily with an invention of a parent application is illustrated. Flowchart 500 begins with the application of an analog calibration signal to an input of an ADC (step 510). The ADC produces a digital output based on the analog calibration signal input (step 520). Operating in the digital domain, at least one parameter relating to the calibration signal is estimated based on the digital output of the ADC (step 530). The calibration signal is reconstructed in the digital domain based on the type of waveform of the analog calibration signal and the one or more estimated parameters (step 540). A reconstruction data structure may be created and stored. The digital outputs of the ADC are compared to the values in the reconstruction data structure to determine a correction data structure (step 550). The correction data structure (e.g., a table in a memory) may then be applied to A/D conversion of functional signals (step 560).

The ADC is therefore calibrated by applying the entries in the correction data structure to the digital ADC outputs of a functional signal. Advantageously, the correction data structure may be updated continuously to account for, e.g., temperature drift. The method described in the flowchart 500 may be considered a first coarse tuning phase that may be alternatively followed by a finer tuning of the correction table in a second phase. During the second phase, the data passed through the correction table is input to the calibrator. The second phase may also stand alone for satisfactory calibration as long as the correction table is initialized.

The inventions of the parent applications as described hereinabove provide for calibration of ADCs working in a relatively narrow frequency band around the calibration signal frequency. However, the method(s) of these parent applications do not solve the problem of wide-band calibration of ADCs because the linearity errors that need to be compensated for are frequency dependent.

However, the invention of parent application U.S. Ser. No. 09/738,229, as well as the present application, provides for calibration of ADCs intended to operate in a broad frequency band. Certain embodiments of one or both of these inventions may involve the following exemplary aspects. Firstly, in order to deal with the frequency dependence of the linearity errors, calibration may be performed using a sequential multi-tone reference signal. That is, the reference signal may include several single-tone sinusoids at different frequencies in sequence. Secondly, the reference signal reconstruction is fully adaptive and performs both the frequency estimation and signal reconstruction on a sample-by-sample basis, enabling a more efficient implementation. One or both of these inventions minimize the communication required between the calibration software and the peripheral calibration equipment (e.g., a sine-wave generator, switching devices, etc.) since the calibration algorithms autonomously detect the reference frequency and the instants at which the frequency changes. Thus, no advanced synchronization between the reference signal generator and the calibration software is needed. All of the calibration procedures can be performed on the digital side of the ADC, requiring only binary control logic/communication to indicate calibration versus correction between the analog and digital side.

Thirdly, the calibration may be performed using discontinuous reference sequences of arbitrary length. This allows the ADC system to initiate a calibration sequence whenever suitable (e.g. when work load is low), terminate it at any time, and continue it again when possible. Aspects of the embodiment(s) described hereinbelow with reference to FIGS. 6A, 6B, and 7 may be incorporated into embodiment(s) of the present invention, as explained further hereinbelow with reference to FIGS. 8 et seq. It should also be noted that discrete/digitized variables may be indicated with "(n)", as well as "(k)".

Figure 6A:
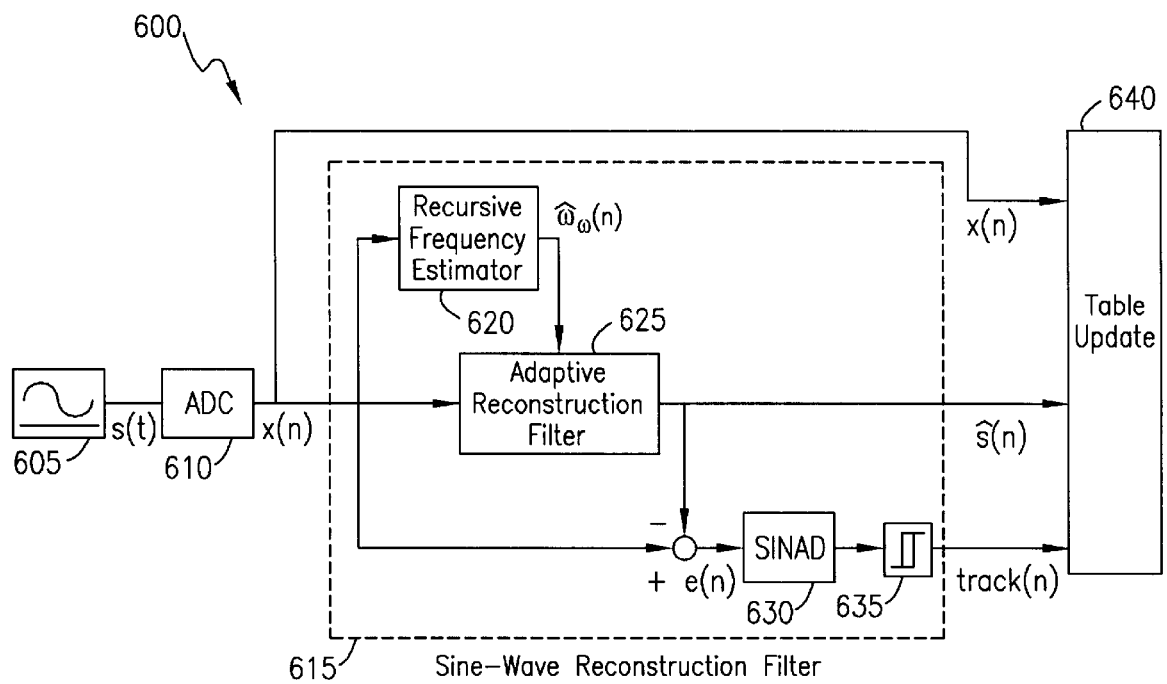
FIG. 6A illustrates exemplary details of one embodiment of wide-band calibration logic in accordance with certain embodiment(s) of the present invention.

Referring now to FIG. 6A, exemplary details of one embodiment of wide-band calibration logic in accordance with certain embodiment(s) of the present invention are illustrated generally at 600. The calibration logic includes an, e.g., sine-wave reconstruction filter 615 and a correction table update block 640. The sine-wave reconstruction filter 615 includes a recursive frequency estimator 620, an adaptive reconstruction filter 625, and a signal-to-noise and distortion ratio (SINAD) estimator 630 with hysteresis logic 635. The recursive frequency estimator 620 and the adaptive reconstruction filter 625 interact to assure fast and accurate convergence of the reconstruction filter.

As shown in FIG. 6A generally at 600, a reference signal generator 605 produces a reference signal s(t) which is used as an input to the ADC 610 to be calibrated. It should be noted that the ADC 610 may correspond to, for example, the ADC 310 (e.g., of FIGS. 3A, 3B, and 4A). The ADC 610 outputs a signal x(n) to the sine-wave reconstruction filter 615, which produces a reconstructed signal ŝ(n). Using an estimate of the signal-to-noise and distortion ratio (SINAD), a determination is made as to whether the reconstruction filter has converged. If the adaptive reconstruction filter 625 has converged at time instant n, the SINAD estimator 630 with hysteresis logic 635 outputs a value track (n) equal to 1. Otherwise track(n) is set to a value of 0. If track(n) has been set to 1, a correction table of the correction table update block 640 is updated using x(n) and ŝ(n) using a scheme that is discussed further hereinbelow.

Recursive Frequency Estimator

The recursive frequency estimator 620 enables the reconstruction filter 615 to converge rapidly to the global minimum. The novel recursive frequency estimator is based upon a least-mean-square (LMS) algorithm which operates on a sample-by-sample basis. The recursive frequency estimation may be achieved in four (4) main steps:

1. Initialize the real scalar parameter θ̂ such that $$-2<\hat{\theta}<2.$$

2. For each sample n, update θ̂ using $$\hat{\theta}(n)=\hat{\theta}(n-1)+\mu\omega x(n-1)(x(n)-\hat{\theta}(n-1)x(n-1)+x(n-2)) \quad (19)$$

3. Estimate the discrete (angular) frequency ω of the input signal from $\hat{\theta}(n)$ using $$\hat{\omega}_\omega(n) = \arccos\frac{\hat{\theta}(n)}{2} \quad (20)$$

4. Increase n and repeat from step 2.

The index ω is used to distinguish the step size and frequency estimate associated with the recursive frequency estimator from the same qualities associated with the reconstruction filter. Here $\mu_\omega$ is the step size of the LMS algorithm. To ensure stability of the LMS algorithm, the step size may be selected as a constant fulfilling the following condition:

$$0 < \mu_\omega < \frac{2}{\alpha^2} \quad (21)$$

where α is the amplitude of the ADC output x(n). Although the least-mean-square algorithm is used in this example, many other recursive algorithms known to those skilled in the art may be used instead.

Adaptive Reconstruction Filter

Figure 7:
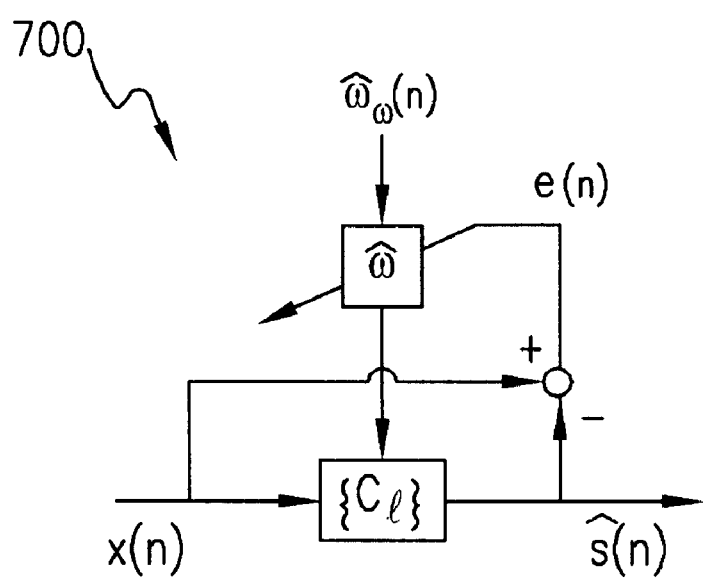
FIG. 7 illustrates an exemplary embodiment of a wide-band adaptive reconstruction filter in accordance with certain embodiment(s) of the present invention.

The signal reconstruction may be performed by a FIR filter, for example, that is updated using a constrained LMS algorithm. Referring now to FIG. 7, an exemplary embodiment of a wide-band adaptive reconstruction filter in accordance with certain embodiment(s) of the present invention is illustrated generally at 700.

Let $C = [c_0, \ldots, c_L]^T$ and $X(n) = [x(n), \ldots, x(n-L)]^T$, then the output of the filter is $$\hat{s}(n) = C^T X(n) = \sum_{l=0}^{L} c_l x(n-l) \quad (22)$$

where L+1 is the length of the filter, e.g., the number of filter coefficients. The filter coefficients are constrained to $$c_l = \frac{(L+1)\cos\omega l + (S_s - S_c)\cos\omega(l+2) - 2S_{sc}\sin\omega(l+2)}{2(S_c S_s - S_{sc}^2)}, \quad (23)$$

$$l = 0, 1, \ldots, L$$

$$S_C = \sum_{l=1}^{L+1}\cos^2\omega l, \; S_S = \sum_{l=1}^{L+1}\sin^2\omega l, \; S_{SC} = \sum_{l=1}^{L-1}\sin\omega l\cos\omega l$$

through the properties of the filter update algorithm. The LMS algorithm may be normalized, e.g., the step size $\mu$ is dependent on the signal power $\|X(n)\|^2$ as shown in Equation 27 hereinbelow. The step size $\mu$ may be selected as a constant if the amplitude is set to a constant.

As described hereinabove, the adaptive reconstruction filter interacts with the recursive frequency estimator. This interaction is necessary to ensure that the adaptive reconstruction filter converges to the global minimum, and not to any of the numerous local minima in the close neighborhood of the global minimum. The filter algorithm described hereinbelow ensures that the filter converges to a frequency close to that obtained from the recursive frequency estimator (within some tolerance $\delta\hat{\omega}_\omega$). In order to improve the performance of the reconstruction filter, the filter updating may be halted when the filter has converged, at which time the filter parameters are stored. A benefit of freezing the converged filter is that small coefficient variations around the optimal values, due to the non-zero step size, cannot perturb the reconstructed signal $\hat{s}(n)$.

Adaptive Reconstruction Filter Algorithm

An adaptive reconstruction filter scheme in accordance with certain embodiment(s) of the present invention may be performed in seven (7) main steps:

1. Initialize the filter coefficients using Equation 23 and a suitable ω, e.g. ω=π/2.

2. For each sample n, if $\hat{\omega}_\omega(n) > 0$, let $$\Delta\omega(n) = \frac{|\hat{\omega}(n) - \hat{\omega}_\omega(n)|}{\hat{\omega}_\omega(n)} \quad (24)$$

$$\hat{\omega}(n) = \begin{cases} \hat{\omega}(n), & \Delta\omega(n) \le \delta \\ \hat{\omega}_\omega(n), & \Delta\omega(n) > \delta \end{cases} \quad (25)$$

3. Reconstruct $\hat{s}(n)$:

$$\hat{s}(n) = C^T(n)X(n) = \sum_{l=0}^{L} c_l(n)x(n-l) \quad (26)$$

If the value of track(n−1)=1 (as explained further hereinbelow under "Convergence Detection"), then the adaptive reconstruction filter has converged, and the updating steps 4, 5, and 6 are not executed, e.g. processing may continue at step 7.

4. Calculate the step size $\mu$ from the normalized step size:

$$\mu = \frac{\bar{\mu}}{1 + \|X(n)\|^2} \quad (27)$$

5. Update $\hat{\omega}$:

$$\hat{\omega}(n+1) = \hat{\omega}(n) - \mu\frac{2}{L}(x(n) - C^T(n)X(n)) \cdot \quad (28)$$

$$(x(n-1)\sin(\hat{\omega}(n)) +$$

$$2x(n-2)\sin(2\hat{\omega}(n)) + \ldots + Lx(n-L)\sin(L\hat{\omega}(n)))$$

6. Update C:

$$S_c = \sum_{l=1}^{L+1}\cos^2\omega l, \; Ss = \sum_{l=1}^{L+1}\sin^2\omega l, \; S_{sc} = \sum_{l=1}^{L+1}\sin\omega l\cos\omega l \quad (29)$$

$$c_l = \frac{(L+1)\cos\omega l + (S_s - S_c)\cos\omega(l+2) - 2S_{sc}\sin\omega(l+2)}{2(S_c S_s - S_{SC}^2)},$$

$$l = 0, 1, \ldots, L$$

$$C(n+1) = [c_0(n+1), \ldots, c_L(n+1)]^T \quad (30)$$

with $\omega = \hat{\omega}(n+1)$ from equation 28 applied to equation 29.

7. Increase n and repeat from step 2.

The algorithm is stable when the normalized step size (which may be set as a design constant) is $0 < \bar{\mu} < 2$, although $\bar{\mu}$ will typically be much less than 2 to achieve low-noise reconstruction of the sine wave. The convergence test threshold δ is a design variable that should be chosen with care. It is preferably small enough not to let $\hat{\omega}$ converge to a false minimum, yet large enough not to let the estimation noise in $\hat{\omega}_\infty$ perturb $\hat{\omega}$. A typical value for δ is, for example, approximately 0.05 when using a filter of length L=100. Although the constrained least-mean-square algorithm is used in this example, many other adaptive filtering algorithms known to those skilled in the art may be used instead.

Convergence Detection

To detect whether the filter has converged or not, a convergence detector in the form of SINAD estimator 630 is used. The SINAD estimator 630 at 600 (of FIG. 6A) estimates the signal-to-noise and distortion ratio for the $L_s$ latest samples as $$SINAD(n) = 20\log\left(\frac{\sum_{k=0}^{L_s}\hat{s}^2(n-k)}{\sum_{k=0}^{L_s}(x(n-k)-\hat{s}(n-k))^2}\right)^{\frac{1}{2}} \quad (31)$$

where $L_s$ is a design variable. The SINAD estimate is then compared to a design variable threshold γ. If the SINAD estimate is greater than γ (plus some hysteresis level provided by hysteresis logic 635), the filter has converged and is reconstructing a usable sine wave. The output signal track (n) is then set to a value of "1". When the SINAD estimate falls below γ (minus a hysteresis level), the filter is no longer properly converged, possibly because the input frequency has changed, and the value of the output signal track(n) is then reset to "0".

The output track(n) of the convergence detector ultimately determines whether the present sample x(n) and the reconstructed signal ŝ(n) are used to update the correction table or not. Although in this example a SINAD detector is used to detect convergence of the adaptive filter, alternatively other convergence detectors known to those skilled in the art may be used.

Updating the Correction Table

The correction table of the correction table update block 640 includes $M=2^b$ entries $\{s_0, \ldots, s_{M-1}\}$, where $s_i$ corresponds to the i-th output level $x_i$ of the ADC 610. Let $A_i(n)$ be the number of times x(j) has been equal to $x_i$ when the adaptive reconstruction filter 625 was converged and j<n. That is $$A_i(n) = \underset{j}{count}\{x(j) = x_i, track(j) = 1 \text{ and } j < n\}. \quad (32)$$

Correction table updating involves two main operations:
1. Initialize the correction table, e.g. $s_i=x_i$, i-0, ..., M-1, before the first calibration sequence.
2. For each sample n, if track(n)=1, update $s_i$ with $$s_i \rightarrow \frac{A_i(n)s_i + \hat{s}(n)}{A_i(n) + 1} \quad (33)$$

In contradistinction to existing approaches, the correction table of the parent application U.S. Ser. No. 09/738,229, as well as that of the present application, need not be reset when the reference signal changes frequency. Consequently, the correction table may be useable over a greater input frequency range than with prior approaches. One scheme for changing the frequency of the reference signal during calibration is the use of step-wise changes in frequency. The reference signal frequency is kept at a constant frequency for a sufficiently long time so that frequency adaptation and some table updates may be accomplished. This time period may be estimated or determined based on experimentation, for example. It should be noted that the step-sizes between calibration frequencies need not be equidistant. For example, frequency steps may be made denser around certain desired frequency sub-ranges and less dense, or even nonexistent, in other sub-ranges.

Correction Scheme

Figure 6B:
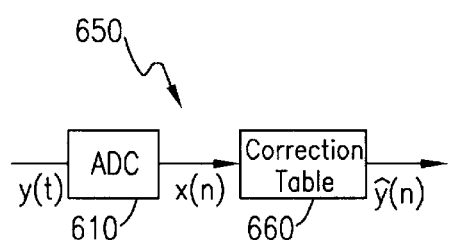
FIG. 6B illustrates exemplary details of one embodiment of wide-band correction logic in accordance with certain embodiment(s) of the present invention.

Referring now to FIG. 6B, exemplary details of one embodiment of wide-band correction logic in accordance with certain embodiment(s) of the present invention are illustrated generally at 650. During normal operation of the ADC, a correction table 660, which has been previously calibrated according to the procedures described herein, is used to correct the output values of the ADC 610. Assuming that the input y(t) produces the ADC output x(n)=$x_i$, then the quantified value $x_i$ is re-mapped using the updated table to ŷ(n)=$s_i$. Thus, a corrected value of ŷ(n) is output by the correction table 660 in response to the input y(t) into the ADC 610.

Wide-band Correction Table Indexing

The wide-band correction logic 650 of FIG. 6B does not specifically illustrate the correction table indexing aspect of the present invention. The present invention is directed to the calibration of ADCs that are intended to operate in a wide frequency band by considering the spectral characteristics of the input signal during look-up compensation, which earlier inventions and methods do not address. These earlier inventions and methods therefore yield the same correction for a given ADC output, regardless of the spectral contents. Because the linearity errors that are sought to be mitigated for are frequency dependent, an improved solution considers a current frequency during correction table look-up.

The wide-band ADC calibration problem was partly solved in the parent application U.S. Ser. No. 09/738,229 using a static compensation table structure, e.g., employing a compensation table that takes only the current ADC output sample as input parameter during look-up. This approach is partly described hereinabove with reference to FIGS. 6A–7, and it does provide a relatively easy way to achieve wide-band ADC compensation, with the simplicity of the scheme and the relatively small compensation table being two important advantages. However, the invention of the parent application U.S. Ser. No. 09/738,229 does not provide true wide-band calibration because it lacks frequency information in the table indexing (e.g., the table addressing).

The present invention diverges from the approach of the parent application U.S. Ser. No. 09/738,229 in the manner in which the compensation table is indexed, for example. In certain embodiment(s) in accordance with the present invention, not only the present ADC sample, but also (at least parts of) previous and/or subsequent samples are used for correction table indexing. Using sample data other than a current/present sample, in conjunction with the current/present data, provides a relatively simple scheme for introducing some kind of spectral information into the table indexing. An important aspect of certain embodiment(s) of the present invention is termed "super-index" herein.

Calibration Scheme with Correction Table Indexing

For certain embodiment(s), wide-band calibration of ADC with correction table indexing may be performed in four (4) main steps:
1. Sample a reference signal s(t) through an ADC, resulting in a discrete time ADC output signal x(n).
2. Reconstruct the reference signal in the digital domain to form the reference signal estimate ŝ(n), (e.g., using the scheme described primarily hereinabove with reference to FIGS. 6A–7).

3. Using (at least portion(s) of) present, previous and/or subsequent samples x(n+1), build a "super-index" I(n) (e.g., using the scheme described primarily hereinbelow with reference to FIGS. 8–12B).

4. Update the correction table entry corresponding to I(n) with ŝ(n) (e.g., using the scheme described primarily hereinbelow under "Updating the Correction Table with Correction Table Indexing").

The reference signal may be, for example, a sequential multi-tone sine wave. In other words, it may be a sinusoidal signal that changes between different fixed frequencies. In mathematical terminology, the reference signal s(t) can be described as $$s(t) = A\sin(2\pi f(t)t), \quad f(t) = \begin{cases} f_0, & t < T_1 \\ f_1, & T_1 \le t < T_2 \\ \vdots \\ f_F & T_{F-1} \le t < T_F \end{cases} \quad (34)$$

Notably, neither the different frequencies $\{f_f\}$ nor the switching times $\{T_f\}$ need be known a priori when using the reconstruction scheme described herein.

Figure 8:
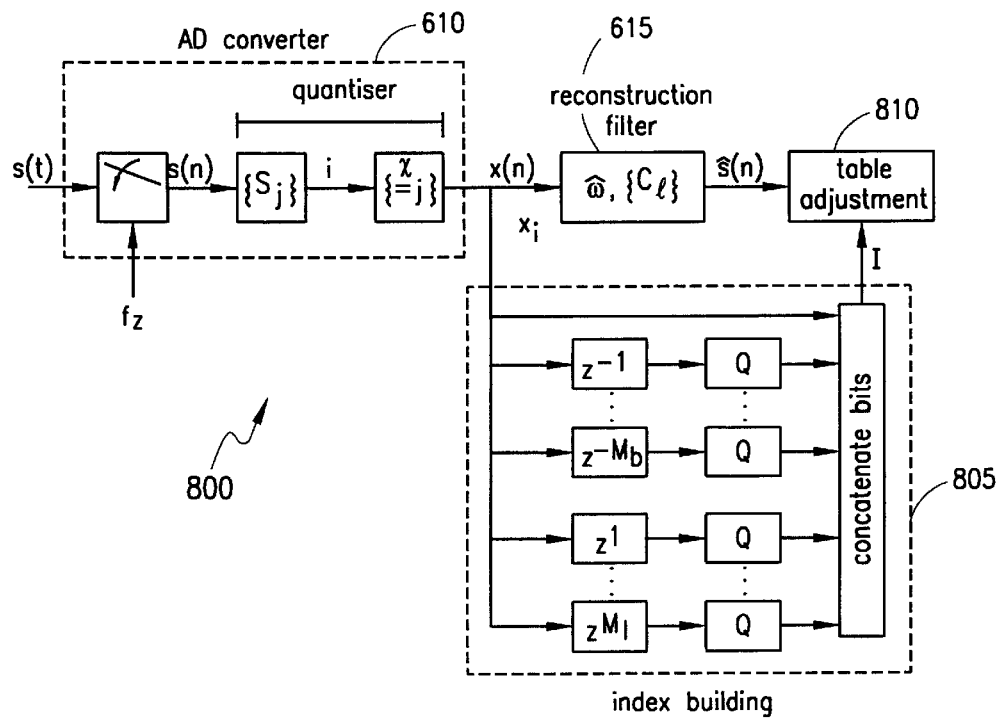
FIG. 8 illustrates an exemplary wide-band embodiment with index building in accordance with the present invention.

Referring now to FIG. 8, an exemplary wide-band embodiment with index building in accordance with the present invention is illustrated generally at 800. An ADC 610 is illustrated, with exemplary components thereof (as described generally with reference to the ADC 310 (of FIG. 4A)) as receiving as input s(t) and providing its output of x(n) as input to a reconstruction filter 615. The reconstruction filter 615 provides its output of ŝ(n) as input to a table adjustment block 810. The table adjustment block also receives as input a "super-index" I, which is the output of an index building block 805. The index building block 805 produces the "super-index" I from input $x_i$.

It should be noted that both the table adjustment block 810 and the index building block 805 may be realized in hardware, software, firmware, some combination thereof, etc. It should also be understood that, while not explicitly shown in FIG. 8, the reconstruction filter 615 may include a two-step filter that is composed of a recursive frequency estimator and an adaptive reconstruction filter. Furthermore, the reconstruction filter 615 may receive as input the signal x(n) from the output of the ADC 610 to produce reconstruction results of a sine-wave estimate ŝ(n) and a tracking indication track(n) (not explicitly illustrated in FIG. 8).

Building a "Super-Index" for Correction Table Indexing

By introducing a compound "super-index" I, which may include, for example, the present sample concatenated with full or truncated parts of previous and/or subsequent samples, the dynamics (e.g., the frequency of the analog input signal s(t)) of x(n) are accounted for when indexing the correction table. An exemplary "super-index" may be built as follows:

For each sample s(n) of the input signal s(t), the quantizer (e.g., of the ADC 610) maps the value into an index i(n) ∈ $\{0, 1, \ldots, 2^N-1\}$ such as s(n)→i(n), where N is the number of bits in the ADC 610. The index i(n) can be represented as a binary number using N bits, $$i(n) = b_{N-1}(n)2^{N-1} + b_{N-2}(n)2^{N-2} + \ldots + b_0(n)2^0 \quad (35)$$

$$= (b_{N-1}b_{N-2} \ldots b_0)_2(n),$$

where $b_{N-1}$ is the most significant bit (MSB).

Now, let ĩ(n) be a binary number consisting of the K most significant bits in i(n), such as $$\tilde{i}(n) = (b_{N-1}b_{N-2} \ldots b_{N-K})_2(n). \quad (36)$$

Then let the "super-index" I(k) include all N bits of i(n) followed by the $M_b$ previous ĩ's and the $M_f$ following ĩ's, as $$I(n) = (i(n)\tilde{i}(n-1) \ldots \tilde{i}(n-M_b)\tilde{i}(n+1) \ldots \tilde{i}(n+M_f))_2. \quad (37)$$

Note that K in equation 36 can be different for the various lags in equation 37 (i.e., the different ĩ's need not be of the same number of bits).

Updating the Correction Table When Using Indexing

An exemplary correction table is composed of $M=2^B$ entries $\{s_0, \ldots, s_{M-1}\}$, where $s_J$ corresponds to the Jth "super-index" level, and B is the total number of bits in the "super-index" I. Let $A_I(n)$ be the number of times I(j)=I when the reconstruction filter was converged and j<n. That is $$A_I(n) = \text{count}_j\{I(j) = I, \text{track}(j) = 1 \text{ and } j < n\}. \quad (38)$$

Correction table updating involves two (2) main operations:

1. Initialization of the correction table. The table entry $s_I$ is preferably initialized with $x_i$ where i is the N most significant bits of I, or, the present sample part of I. In other words, $s_I = x_i$, $i = Q_N[I]$, where Q is the quantization operator.

2. For each sample n, if track(n) equals 1, update $s_I$ with $$s_I \rightarrow \frac{A_I(n)s_I + \hat{s}(n)}{A_I(n) + 1}. \quad (39)$$

Typically, numerous different frequencies are preferably used for calibration before a significant part of the compensation/correction table has been excited.

Correction Scheme with Correction Table Indexing

Figure 9:
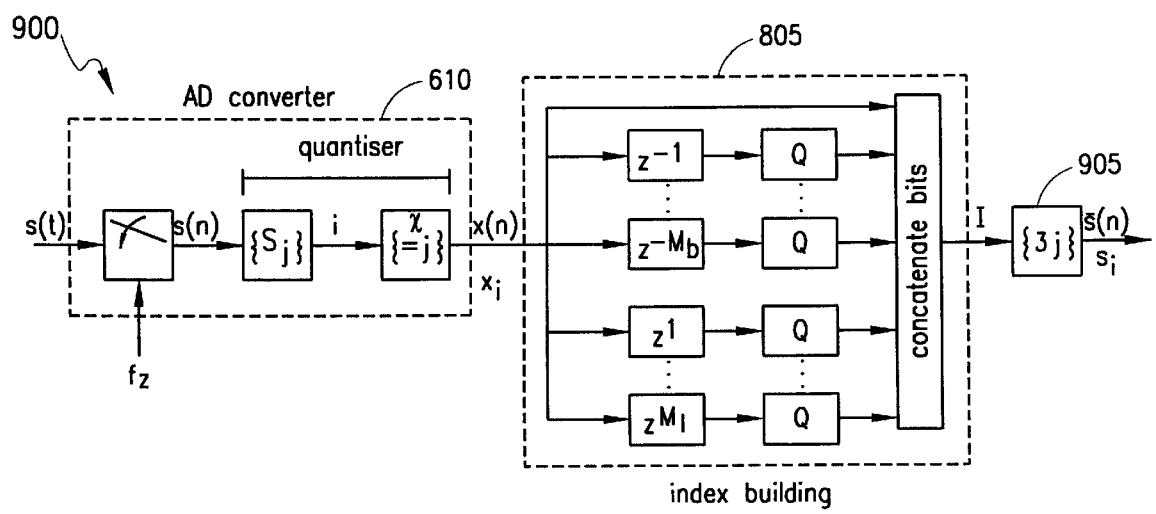
FIG. 9 illustrates another exemplary wide-band embodiment with index building in accordance with the present invention.

Referring now to FIG. 9, another exemplary wide-band embodiment with index building in accordance with the present invention is illustrated generally at 900. While the exemplary wide-band embodiment 800 (of FIG. 8) illustrates an exemplary training/calibration phase for an ADC compensation scheme, the exemplary wide-band embodiment 900 illustrates an exemplary functional phase for the ADC compensation scheme. It should be noted that the exemplary wide-band embodiments 800 and 900 may be used separately, cooperatively, successively, simultaneously, etc. (e.g., as described hereinabove with reference to FIGS. 3A and 3B). The exemplary wide-band embodiment 900 includes a wide-band correction table block 905 that receives as input during functional use the "super-index", which is output from the index building block 805. It should be noted that the wide-band correction table block 905 may include a correction table data structure and may be stored in, or be part of, any general or special-purpose memory, for example.

During normal ADC operation, the correction table of the correction table block 905 is used to correct the output values of the ADC. The corrector utilizes the same "super-index" building algorithm as the calibration scheme. The complete compensated analogue-to-digital conversion becomes y(t)→$x_i$→I→$S_I$=ŷ(n), where y(t) is the continuous time input signal to the ADC. If future samples (x(n+l), l>0) are used in the "super-index"; in other words, if $M_f \ne 0$, then the corrected output ŷ(n) is delayed by $M_f$ samples.

Figure 10:
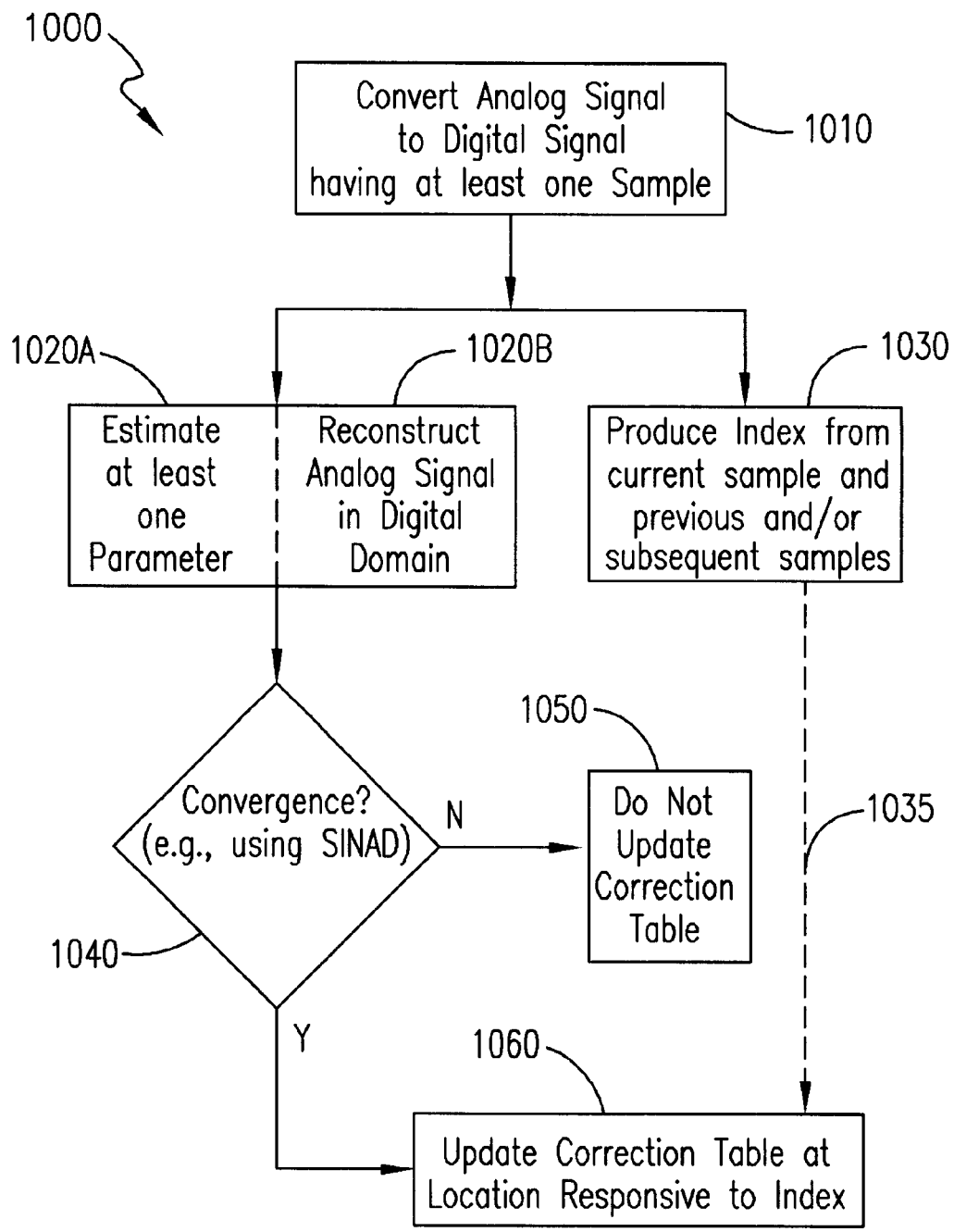
FIG. 10 illustrates an exemplary method in flowchart form for updating a wide-band correction table of analog-to-digital conversion compensation in accordance with the present invention.

Referring now to FIG. 10, an exemplary method in flowchart form for updating a wide-band correction table of analog-to-digital conversion compensation in accordance with the present invention is illustrated generally at 1000. An analog signal is converted to a digital signal having at least one sample (block 1010). It is noted that the analog signal (of block 1010) is preferably a calibration/reference analog signal. The digital signal (e.g., formed from one or more samples) is used to estimate at least one parameter of the analog signal (block 1020A), and the analog signal is reconstructed in the digital domain (block 1020B). It should be understood that the blocks 1020A and 1020B are shown joined by a dotted line to represent the interrelationship that may exist between, for example, a recursive frequency estimator and an adaptive reconstruction filter, in accordance with certain embodiment(s) of the present invention.

From the digital signal (e.g., formed from one or more samples) of block 1010, an index (e.g., a "super-index") may be produced using a current sample and one or more of previous and/or subsequent sample(s) (block 1030). This index may be produced, for example, by truncating bits from the samples and then concatenating the truncated portions (e.g., as described hereinabove with reference to FIGS. 8 and 9). It should be noted that the index production (of block 1030) may occur before, during, and/or after the parameter estimation and signal reconstruction (of blocks 1020A and 1020B, respectively), as indicated by the side-by-side illustration of the relevant blocks in the flowchart 1000. In other words, and by way of example only, the index production may be effectuated fully or partially in parallel with the parameter estimation and signal reconstruction.

After the parameter estimation and signal reconstruction (of blocks 1020A and 1020B, respectively), whether or not the filter(s) have converged is determined (e.g., using a SINAD as described hereinabove with reference to FIG. 6A) (block 1040). If not, then a correction table is not updated (block 1050). If, on the other hand, the filter(s) have converged (as determined at block 1040), then the correction table is updated at a location responsive to (e.g., determined by, addressed at, etc.) the index (block 1060). It should be noted that the index (from block 1030) need only be utilized for correction table updating (at block 1060) if the filter(s) are determined to have converged (at block 1040), as indicated by the broken arrow (dashed directional line) 1035.

Figure 11:
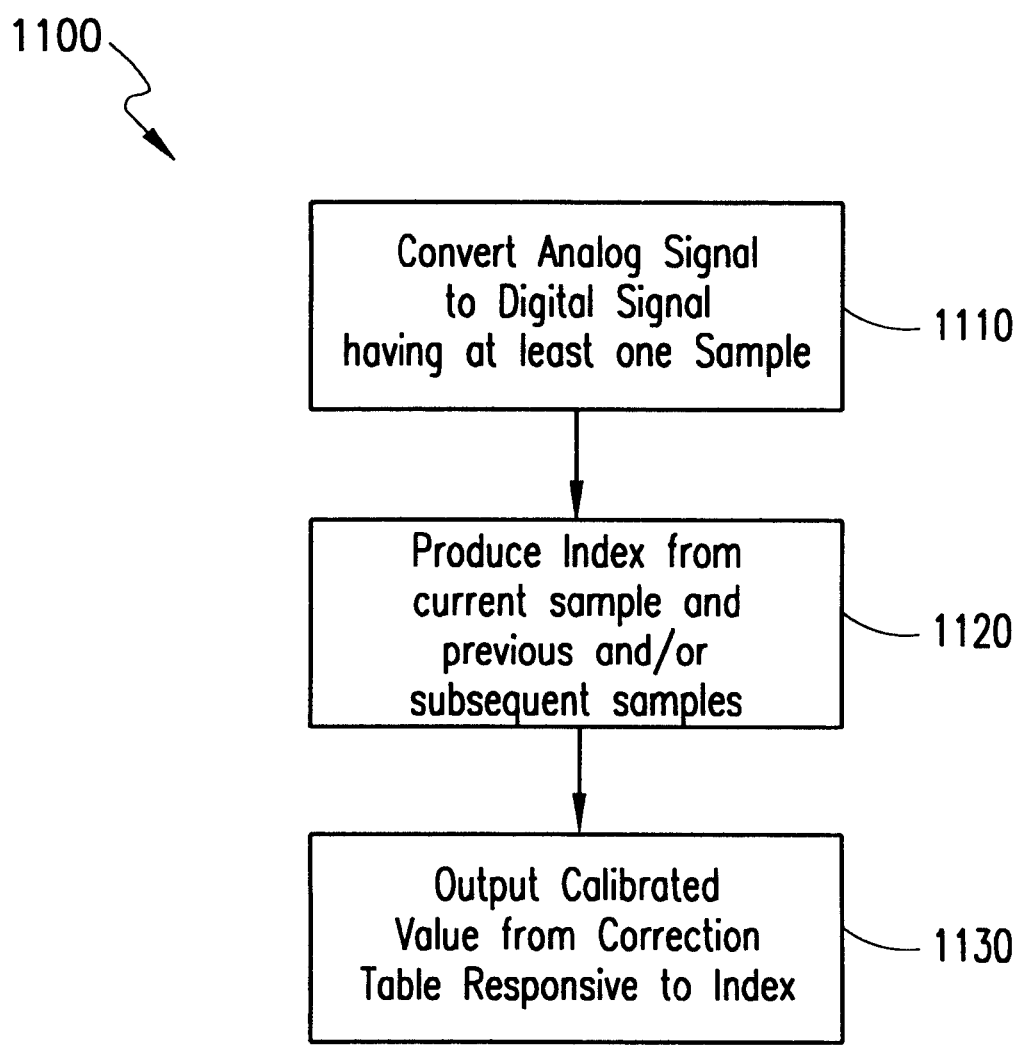
FIG. 11 illustrates an exemplary method in flowchart form for utilizing a wide-band correction table during analog-to-digital conversion compensation in accordance with the present invention.

Referring now to FIG. 11, an exemplary method in flowchart form for utilizing a wide-band correction table during analog-to-digital conversion compensation in accordance with the present invention is illustrated generally at 1100. An analog signal is converted to a digital signal having at least one sample (block 1110). It is noted that the analog signal (of block 1110) is preferably a functional analog signal. From the digital signal (e.g., formed from one or more samples) of block 1110, an index (e.g., a "super-index") may be produced using a current sample and one or more of previous and/or subsequent sample(s) (block 1120). This index may be produced, for example, by truncating bits from the samples and then concatenating the truncated portions (e.g., as described hereinabove with reference to FIGS. 8 and 9). After an index is produced (at block 1120), then a calibrated value may be output from a correction table at a location responsive to (e.g., determined by, addressed at, etc.) the index (block 1130).

Figure 12A:
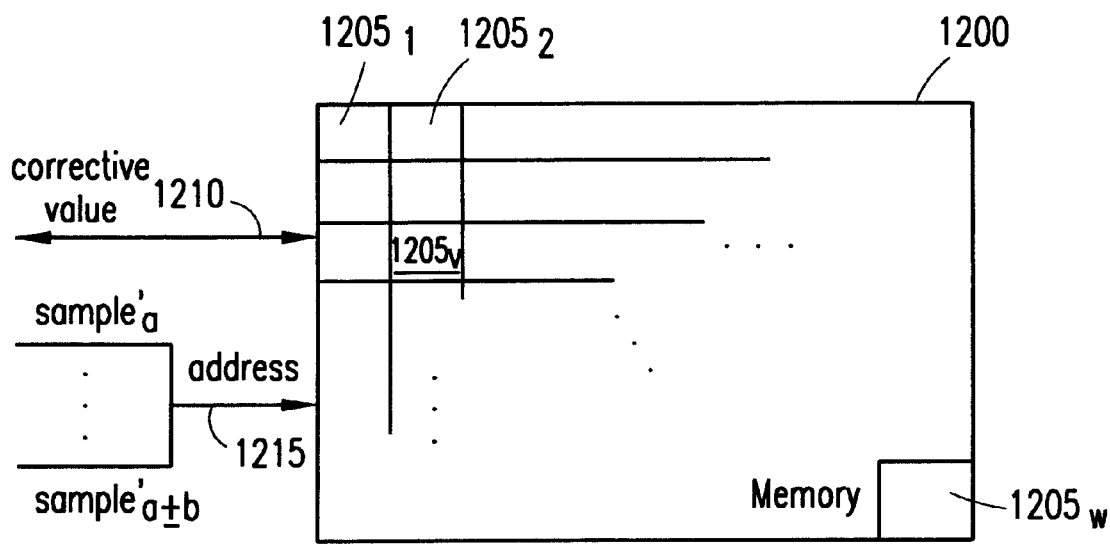
FIG. 12A illustrates a first wide-band analog-to-digital conversion corrective data structure in accordance with the present invention.

Referring now to FIG. 12A, a first wide-band analog-to-digital conversion corrective data structure in accordance with the present invention is illustrated generally at 1200. A memory 1200 stores a corrective data structure (e.g., similar or analogous to the correction table block 905 (of FIG. 9)) for wide-band calibration/compensation of analog-to-digital conversion. The memory 1200 may be composed of or correspond to, for example, volatile memory, non-volatile memory, random access memory (RAM), electrically-erasable programable read-only memory (EEPROM), a hard disk, optical storage media, etc. The memory 1200 stores corrective values $1205_1, 1205_2, \ldots 1205_v, \ldots 1205_w$, v<w. These corrective values $1205_1 \ldots 1205_w$ may be accessed to/from the memory 1200 via an input, output, and/or an input/output access port 1210 (e.g., a latch, a data bus, a read/write head, etc.). Each of the corrective values $1205_1 \ldots 1205_w$ may be accessed (e.g., retrieved, stored, modified, etc.) from the memory 1200 using an address 1215 (e.g., an index or "super-index", etc.). The address 1215 may be formed from and/or composed of all or portions of two or more samples. The samples may correspond to sample'$_a$ ... sample'$_{a \pm b}$. Besides the, e.g., current sample (sample'$_a$), sample(s) preceding and/or following (sample'$_{a \pm b}$) may be relied on to form the address 1215. It should be noted (i) that the apostrophe "'" indicates that only portions of (e.g., less than all bits representing) the samples may optionally be used, (ii) that the subscript "b" may have a different value when representing samples leading the current sample versus when representing samples trailing the current sample, and (iii) that both leading sample(s) and trailing sample(s) need not be used.

Figure 12B:
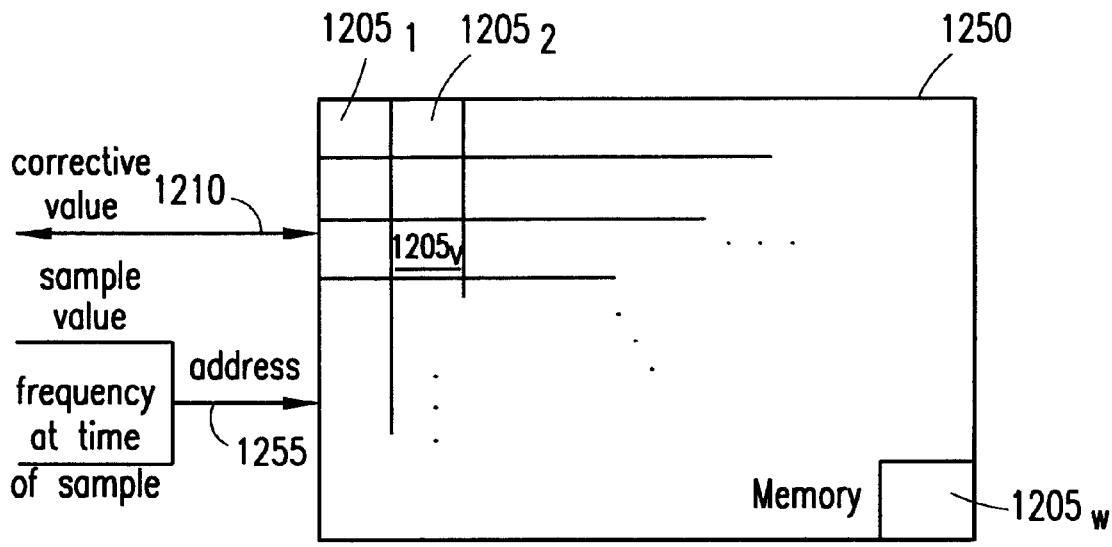
FIG. 12B illustrates a second wide-band analog-to-digital conversion corrective data structure in accordance with the present invention.

Referring now to FIG. 12B, a second wide-band analog-to-digital conversion corrective data structure in accordance with the present invention is illustrated generally at 1250. A memory 1250 stores a corrective data structure (e.g., similar or analogous to the correction table block 905 (of FIG. 9)) for wide-band calibration/compensation of analog-to-digital conversion. The memory 1250 may be composed of or correspond to, for example, volatile memory, non-volatile memory, random access memory (RAM), electrically-erasable programable read-only memory (EEPROM), a hard disk, optical storage media, etc. The memory 1250 stores corrective values $1205_1, 1205_2, \ldots 1205_v, \ldots 1205_w$, v<w. These corrective values $1205_1 \ldots 1205_w$ may be accessed to/from the memory 1250 via an input, output, and/or an input/output access port 1210 (e.g., a latch, a data bus, a read/write head, etc.). Each of the corrective values $1205_1 \ldots 1205_w$ may be accessed (e.g., retrieved, stored, modified, etc.) from the memory 1250 using an address 1255 (e.g., an index or "super-index", etc.). The address 1255 may be formed from a sample value (e.g., a current sample) of the relevant signal and a frequency (e.g., at or near the current sample) of the relevant signal. It should be noted that having corrective values stored (e.g., during calibration) to the corrective data structure and output (e.g., during functional use) from the corrective data structure based not only on the sample value, but also on the frequency as well, enables the corrective data structure to be calibrated/compensated for a true wide-band analog-to-digital conversion implementation.

Performance Examples with Correction Table Indexing

The performance of certain exemplary embodiment(s) of the present invention was evaluated with authentic ADC data from an Analog Devices AD876 10-bit converter. Calibration was performed using a calibration signal totaling 41 ms in example 1 and 8 to 82 ms in example 2. These calibration signals consisted of single-tone sine waves with amplitude −0.45 dBFS (0.95% of full scale amplitude). During the calibration time, the tone changed between several frequencies.

Available data consisted of 887 sequences of 16384 samples each. Every sequence was a sampling of a sine tone with amplitude −0.45 dBFS and a unique frequency, resulting in a data set of 887 different frequencies. The sample rate was 20 MSPS. For reasons of simplicity, the calibration signals were formed by assembling a number of 16 k sequences after each other. It should be noted that all 887 available sequences were never used during one calibration run.

Regarding the evaluation method, the performance of the dynamic compensation system was tested for different "super-index" configurations. Let the notation $[K_{ML} \ldots K_1 \, N \, K_{-1} K_{-Mf}]$ denote that the "super-index" was built starting with all N bits of i(n) (indicated by the boldface "N"), followed by the $K_1$ most significant bits of i(n−1) up to the $K_{Mb}$ most significant bits of i(n−$M_b$), and finally the $K_{-1}$ most significant bits of i(n+1) up to the $K_{-Mf}$ most significant bits of i(n+$M_f$). For example, [4 2 10 4] means that the index is the concatenation of all 10 bits of i(n), the 2 MSBs of i(n−1), the 4 MSBs of i(n−2), and the 4 MSBs of i(n+1).

The tests were conducted in the following manner for every index configuration:

1. Reset and initialize the compensation table.
2. Calibrate the table using $n_{fcal}$ different frequencies, chosen at random from the entire set of data sequences.
3. Evaluate the compensation performance at $n_{feval}$ different frequencies, chosen at random from the subset of frequencies not used for calibration. Calculate the spurious-free dynamic range (SFDR) and signal-to-noise and distortion ratio (SINAD) for each evaluation frequency.
4. Repeat from 1. Test each configuration $n_{test}$ times. In the presentation described below, the median improvement over all tests for every exemplary configuration is given. As an indication of how well the calibration signals managed to excite the compensation table, the "fill rate" is presented. This equates here to the percentage of the table entries that were actually altered during calibration.

Figure 13A:
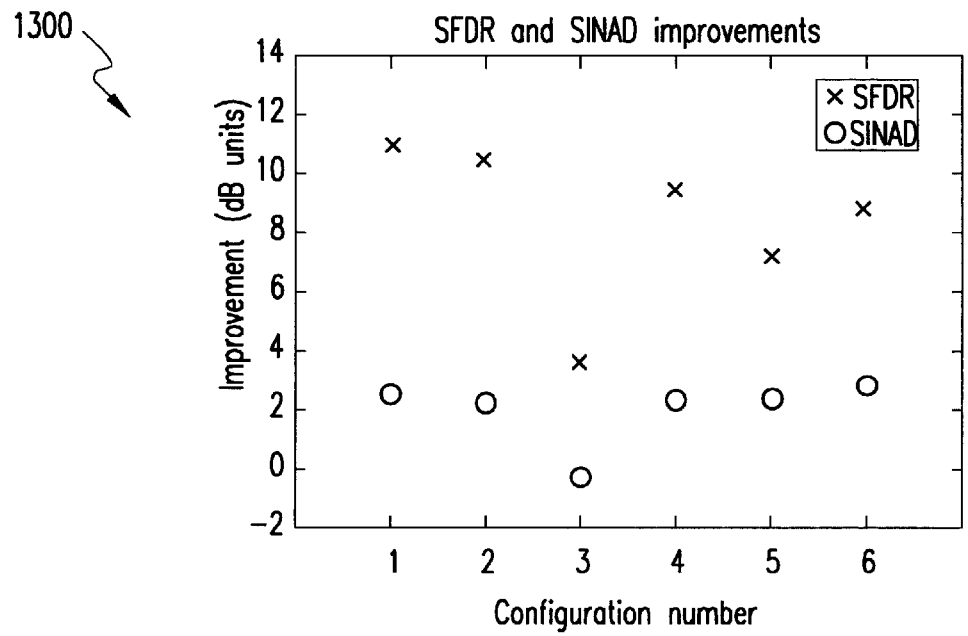
FIGS. 13A and 13B illustrate exemplary first and second performance characteristic results in graphical form for different exemplary "super-index" configurations in accordance with the present invention.
Figure 13B:
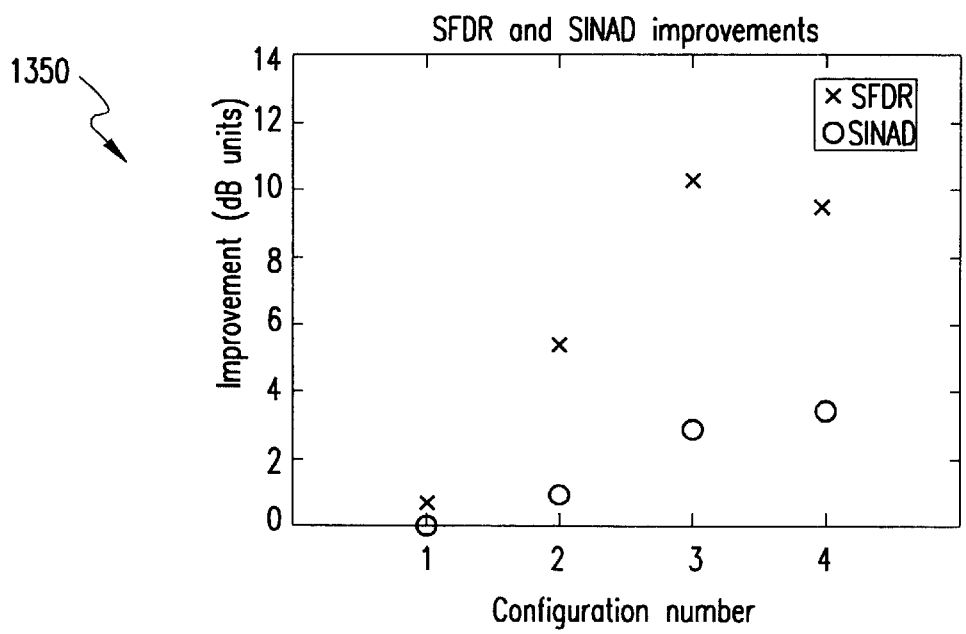

Referring now to FIGS. 13A and 13B, exemplary first and second performance characteristic results in graphical form for different exemplary "super-index" configurations in accordance with the present invention are illustrated generally at 1300 and 1350, respectively. Graph 1300 illustrates the effect of different "super-index" configurations. In this example, the number of calibration frequencies $n_{fcal}$=50, the number of evaluation frequencies $n_{feval}$=20, and the number of tests per configuration $n_{test}$=10. Specifically, the exemplary different "super-index" configurations for the graph 1300 are provided in Table 2.

TABLE 2

Results using different index configurations.

| Number | Configuration | Table fill rate |
|---|---|---|
| 1 | [4 4 10] | 19% |
| 2 | [10 4 4] | 19% |
| 3 | [8 10] | 36% |
| 4 | [1 1 1 1 1 1 1 1 1 10] | 15% |
| 5 | [4 10] | 93% |
| 6 | [2 2 2 10] | 39% |

It should be understood that the "table fill rate" is presented as an indication of how well the calibration signals managed to excite the compensation table. The "table fill rate" equates to the percentage of table entries that were actually altered during the calibration.

Continuing now with graph 1350, it illustrates the effects of the number of calibration frequencies, $n_{fcal}$, on the results. As before, the number of evaluation frequencies $n_{feval}$=20, and the number of tests per configuration $n_{test}$=10. Specifically, the exemplary different numbers of calibration frequencies, while maintaining the index configurations fixed, for the graph 1350 are provided in Table 3.

TABLE 3

Results using different number of calibration frequencies while maintaining the index configuration fixed.

| Number | Configuration | $n_{fcal}$ | Table fill rate |
|---|---|---|---|
| 1 | [4 4 10] | 10 | 7% |
| 2 | [4 4 10] | 20 | 12% |
| 3 | [4 4 10] | 50 | 20% |
| 4 | [4 4 10] | 100 | 25% |

The results of the graphs 1300 and 1350 indicate that the dynamic compensation scheme can yield significant improvements in SFDR and at least moderate SINAD improvement.

The present invention (the term "present invention" is used in this paragraph to connote at least particular embodiment(s) of the present invention, but not necessarily all embodiments) has several advantages over preexisting approaches. An advantage of at least some wide-band embodiment(s) is that the calibration and compensation schemes are truly dynamic, in the sense that different correction terms are invoked for different frequencies. This is particularly advantageous because the linearity errors that are sought to be mitigated for are, in most cases, frequency dependent. Another advantage is that the present invention is robust against variations in the analog reference signal because of the adaptivity of the reconstruction algorithms. Hence, the calibration signal generator does not have to be long-term stable, only relatively spectrally pure. Yet another advantage of the present invention is that the calibration scheme may be fully implemented in software. The calibration procedures are performed on the digital side of the ADC, requiring only binary control logic/communication for calibration and correction between the analog and digital side. Another advantage occurs as a result of the fact that the calibration algorithms are not real-time critical applications. If the sampled reference signal is stored in a memory, the calibration algorithms may be processed in the background on a low priority level while the ADC is in normal operation. Furthermore, sequential multi-tone calibration is advantageous due to its relatively simple implementation. The reference signal may be generated from a single voltage-controlled oscillator, which is a simplification compared to those calibration schemes that require a separate digital-to-analog converter. In another advantage, calibration may be performed using reference sequences of any length that are only longer than the settling time for the reconstruction filter. Moreover, the calibration procedures may be initiated, interrupted, and continued at any time suitable for or convenient to the rest of the system.

Although preferred embodiment(s) of the method, arrangement, and system of the present invention have been illustrated in the accompanying Drawings and described in the foregoing Detailed Description, it will be understood that the present invention is not limited to the embodiment(s) disclosed, but is capable of numerous rearrangements, modifications, and substitutions without departing from the spirit and scope of the present invention as set forth and defined by the following claims.

What is claimed is:

1. An apparatus that includes a signal processing device, the signal processing device comprising:
   an analog-to-digital converter (ADC), said ADC having at least one analog input and at least one digital output;
   a first processor, said first processor for adaptively estimating at least one first parameter relating to the at least one analog input of said ADC, the at least one first parameter being estimated based, at least partly, on the at least one digital output of said ADC;
   a filter, said filter having an input coupled to the at least one digital output of said ADC and receiving the at least one first parameter, said filter including a plurality of coefficients that adapt to minimize a noise gain of said filter; and
   a second processor, said second processor for building concatenated indices from various time lags of the at least one digital output of said ADC.

2. The apparatus according to claim 1, wherein the signal processing device further comprises:
   a third processor, said third processor for computing at least one second parameter relating an output of said filter to the input of said filter; and
   a fourth processor, said fourth processor for computing a correction table in dependence upon the output of said filter and the concatenated indices.

3. The apparatus according to claim 2, wherein the signal processing device further comprises:
   a fifth processor, said fifth processor for outputting a calibrated value from said correction table based, at least partly, on a functional analog input and at least one concatenated index.

4. The apparatus according to claim 2, wherein the at least one second parameter comprises a signal-to-noise and distortion ratio (SINAD) of said filter.

5. The apparatus according to claim 2, wherein at least one of said first, second, third, and fourth processors comprise one or more software modules.

6. The apparatus according to claim 1, wherein the various time lags comprise at least one past time differential, at least one future time differential, or both at least one past and at least one future time differential.

7. The apparatus according to claim 1, wherein the at least one digital output of said ADC comprises a plurality of digital outputs of said ADC, and the concatenated indices are built using at least portions of the plurality of digital outputs of said ADC.

8. A method for calibrating analog-to-digital conversion (ADC), comprising the steps of:
   converting an analog signal to a digital signal, the digital signal including at least one sample;
   producing an index value from the at least one sample and at least one of a previous sample and a subsequent sample; and
   updating a correction table responsive to the index value.

9. The method according to claim 8, wherein said step of updating a correction table responsive to the index value comprises the step of updating the correction table at a location responsive to the index value using another value that is based, at least partly, on the at least one sample.

10. The method according to claim 8, wherein said step of updating a correction table responsive to the index value comprises the step of updating the correction table responsive to a history of samples, each sample of the history of samples corresponding to the index value.

11. The method according to claim 8, wherein said step of producing an index value from the at least one sample and at least one of a previous sample and a subsequent sample comprises the step of concatenating a plurality of bits associated with the at least one sample and the at least one of the previous sample and the subsequent sample.

12. The method according to claim 11, wherein the at least one sample is comprised of a first plurality of bits, the at least one of the previous sample and the subsequent sample is comprised of a second plurality of bits, and the plurality of bits concatenated in said step of concatenating a plurality of bits is comprised of at least a first portion of the first plurality of bits and at least a second portion of the second plurality of bits.

13. The method according to claim 12, wherein the plurality of bits concatenated in said step of concatenating a plurality of bits is comprised of all of the first plurality of bits and all of the second plurality of bits.

14. The method according to claim 12, wherein a first number of bits corresponding to the first portion of the first plurality of bits differs from a second number of bits corresponding to the second portion of the second plurality of bits.

15. The method according to claim 8, further comprising the steps of:
   recursively estimating at least one parameter of the analog signal based, at least partly, on the at least one sample;
   adaptively reconstructing the analog signal in the digital domain based, at least partly, on the at least one parameter;
   determining whether the reconstruction has converged;
   if so, executing said step of updating a correction table responsive to the index value; and
   if not, then not executing said step of updating a correction table responsive to the index value, for at least the at least one sample.

16. The method according to claim 8, wherein the analog signal comprises an analog calibration signal that steps through a plurality of frequencies.

17. A method for calibrating analog-to-digital conversion (ADC), comprising the steps of:
   converting an analog signal to a digital signal, the digital signal including at least one sample;
   producing an index value from the at least one sample and at least one of a previous sample and a subsequent sample;
   applying the index value or a derivative thereof to a correction table; and
   outputting a corrective calibration value from the correction table responsive to said step of applying the index value or a derivative thereof to a correction table.

18. The method according to claim 17, wherein the analog signal comprises a functional signal.

19. The method according to claim 17, wherein said step of producing an index value from the at least one sample and at least one of a previous sample and a subsequent sample comprises at least one of the following steps:
   producing the index value from the at least one sample and a plurality of previous samples;
   producing the index value from the at least one sample and a plurality of subsequent samples; and
   producing the index value from the at least one sample and a plurality of previous samples and a plurality of subsequent samples.

20. The method according to claim 17, further comprising the step of:

accumulating a history of samples produced as a result of said step of converting an analog signal to a digital signal, the history of samples comprising the at least one sample and the at least one of a previous sample and a subsequent sample.

21. The method according to claim 20, wherein said step of producing an index value from the at least one sample and at least one of a previous sample and a subsequent sample comprises the step of producing the index value from the history of samples.

22. The method according to claim 21, wherein said step of producing the index value from the history of samples comprises the steps of:

extracting a number or numbers of most significant bits from a plurality of samples of the history of samples to produce a plurality of most significant bit sets; and concatenating bits from the at least one sample and the plurality of most significant bit sets.

23. The method according to claim 21, wherein the history of samples comprise a chronological set of samples having an oldest sample and a newest sample, the at least one sample being neither the oldest sample nor the newest sample.

24. A system for calibrating analog-to-digital conversion (ADC), comprising:

means for converting an analog signal to a digital signal, the digital signal including at least one sample;

means for producing an index value from the at least one sample and at least one of a previous sample and a subsequent sample;

means for recursively estimating at least one parameter of the analog signal based, at least partly, on the at least one sample;

means for adaptively reconstructing the analog signal in the digital domain based, at least partly, on the at least one parameter;

means for determining whether the reconstruction has converged; and means for updating a correction table, said means for updating a correction table in operative communication with said means for determining whether the reconstruction has converged, said means for updating a correction table adapted to update the correction table responsive to the index value when the reconstruction has converged.

25. A system for calibrating analog-to-digital conversion (ADC), comprising:

means for converting an analog signal to a digital signal, the digital signal including at least one sample;

means for producing an index value from the at least one sample and at least one of a previous sample and a subsequent sample, said means for producing an index value including means for storing at least a portion of each of the at least one sample and the at least one of a previous sample and a subsequent sample;

means for providing a correction table;

means for applying the index value or a derivative thereof to said means for providing a correction table; and means for outputting a corrective calibration value from said means for providing a correction table responsive to said means for applying the index value or a derivative thereof to said means for providing a correction table.

26. An arrangement for calibrating analog-to-digital conversion, comprising:

an analog-to-digital converter (ADC), said ADC for converting an analog signal to a digital signal, the digital signal including at least one sample;

an index builder, said index builder receiving the at least one sample, said index builder for building an index value from the at least one sample and at least one of a previous sample and a subsequent sample;

a correction table, said correction table including a plurality of entries; and a correction table adjuster, said correction table adjuster having access to the index value, said correction table adjuster for altering at least one entry of the plurality of entries, the at least one entry determinable, at least partly, by the index value.

27. The arrangement according to claim 26, wherein the arrangement comprises a base station in a wireless network.

28. The arrangement according to claim 26, wherein said index builder includes a plurality of storage locations.

29. The arrangement according to claim 28, wherein said index builder further includes a plurality of quantization units, each quantization unit of the plurality of quantization units associated with a respective storage location of the plurality of storage locations, each of the respective storage locations configured to forward a respective sample stored therein.

30. The arrangement according to claim 29, wherein each quantization unit of the plurality of quantization units is configured to forward a respective number of bits of the respective sample stored in the associated respective storage location.

31. The arrangement according to claim 30, wherein the respective number of bits for a first respective sample differs from the respective number of bits for a second respective sample.

32. The arrangement according to claim 30, wherein said index builder further includes a concatenating unit, the concatenating unit being adapted to receive the respective number of bits forwarded from each quantization unit of the plurality of quantization units.

33. The arrangement according to claim 32, wherein the concatenating unit is further adapted to concatenate the received respective number of bits forwarded from each quantization unit of the plurality of quantization units to produce at least a portion of the index value.

34. The arrangement according to claim 33, wherein the concatenating unit is further adapted to concatenate the received respective number of bits forwarded from each quantization unit of the plurality of quantization units and the at least one sample to produce the index value.

35. The arrangement according to claim 28, wherein a first storage location of the plurality of storage locations stores the at least one sample, and a second storage location of the plurality of storage locations stores the at least one of a previous sample and a subsequent sample.

36. An arrangement for calibrating analog-to-digital conversion, comprising:

an analog-to-digital converter (ADC), said ADC for converting an analog input to a digital output, the analog input corresponding to an amplitude and a frequency;

a memory, said memory including a plurality of entries, each entry of the plurality of entries storing an ADC correction value; and wherein the plurality of entries are organized in said memory in a data structure accessible by an address derived, at least partly, from the amplitude of the analog input and the frequency of the analog input.

37. The arrangement according to claim 36, wherein the arrangement comprises a node in a telecommunications network.

38. The arrangement according to claim 37, wherein the node comprises a base station, and the telecommunications network comprises a wireless network.

39. The arrangement according to claim 36, wherein the digital output includes at least one sample, and the address is derived responsive to the at least one sample and the frequency of the analog input at a time at which the at least one sample is sampled by said ADC.

40. An arrangement for calibrating analog-to-digital conversion, comprising:

an analog-to-digital converter (ADC), said ADC for converting an analog input to a digital output, the analog input corresponding to a first attribute and a second attribute;

a memory, said memory including a plurality of entries, each entry of the plurality of entries storing an ADC correction value; and wherein the plurality of entries of said memory are organized in a data structure that is accessible by an address derived responsive to the first attribute of the analog input and the second attribute of the analog input.

41. An arrangement for calibrating analog-to-digital conversion, comprising:

an analog-to-digital converter (ADC), said ADC for converting an analog input to a digital output, the digital output including at least one sample and at least one of a previous sample and a subsequent sample;

a memory, said memory including a plurality of entries, each entry of the plurality of entries storing an ADC correction value; and wherein the plurality of entries of said memory are stored in a data structure that is addressable responsive to the at least one sample and the at least one of a previous sample and a subsequent sample.

42. An arrangement for calibrating analog-to-digital conversion, comprising:

an analog-to-digital converter (ADC) for receiving an analog input and producing a digital output;

a reconstruction filter for reconstructing the analog input in the digital domain from the digital output;

a first memory for storing a history of the digital output;

a second memory for storing corrective calibration values; and wherein the history of the digital output is used to access the second memory.

43. The arrangement according to claim 42, wherein the first memory and the second memory comprise a single memory.

* * * * *